(12) United States Patent
Kim et al.

(10) Patent No.: US 8,227,354 B2
(45) Date of Patent: Jul. 24, 2012

(54) METHOD OF FORMING SEMICONDUCTOR DEVICE PATTERNS

(75) Inventors: Bong-cheol Kim, Seoul (KR); Dae-youp Lee, Gyeonggi-do (KR); Sang-youn Jo, Gyeonggi-do (KR); Ja-min Koo, Gyeonggi-do (KR); Byeong-hwan Son, Gyeonggi-do (KR); Jang-hwan Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 495 days.

(21) Appl. No.: 12/480,807

(22) Filed: Jun. 9, 2009

(65) Prior Publication Data
US 2010/0173492 A1 Jul. 8, 2010

(30) Foreign Application Priority Data
Jan. 7, 2009 (KR) .................. 10-2009-0001245

(51) Int. Cl.
*H01L 21/302* (2006.01)
(52) U.S. Cl. ........ 438/717; 438/725; 438/696; 438/401; 257/E23.179; 257/E21.219; 365/185.17; 365/63
(58) Field of Classification Search .................. 438/401, 438/696, 717, 725; 257/E23.179, E21.219; 365/185.17, 63
See application file for complete search history.

(56) References Cited

U.S. PATENT DOCUMENTS
7,885,114 B2* 2/2011 Park et al. ................ 365/185.17

FOREIGN PATENT DOCUMENTS
JP 2007-305970 11/2007
KR 1020050052213 6/2005
KR 1020060113162 11/2006
* cited by examiner

*Primary Examiner* — Nadine G. Norton
*Assistant Examiner* — Maki Angadi
(74) *Attorney, Agent, or Firm* — Myers Bigel Sibley & Sajovec, P.A.

(57) ABSTRACT

Provided is a method of forming patterns of a semiconductor device, whereby patterns having various widths can be simultaneously formed, and pattern density can be doubled by a double patterning process in a portion of the semiconductor device. In the method of forming patterns of a semiconductor device, a first mold mask pattern and a second mold mask patter having different widths are formed on a substrate. A pair of first spacers covering both sidewalls of the first mold mask pattern and a pair of second spacers covering both sidewalls of the second mold mask pattern are formed. The first mold mask pattern and the second mold mask pattern are removed, and a wide-width mask pattern covering the second spacer is formed. A lower layer is etched using the first spacers, the second spacers, and the wide-width mask pattern as an etch mask.

18 Claims, 30 Drawing Sheets

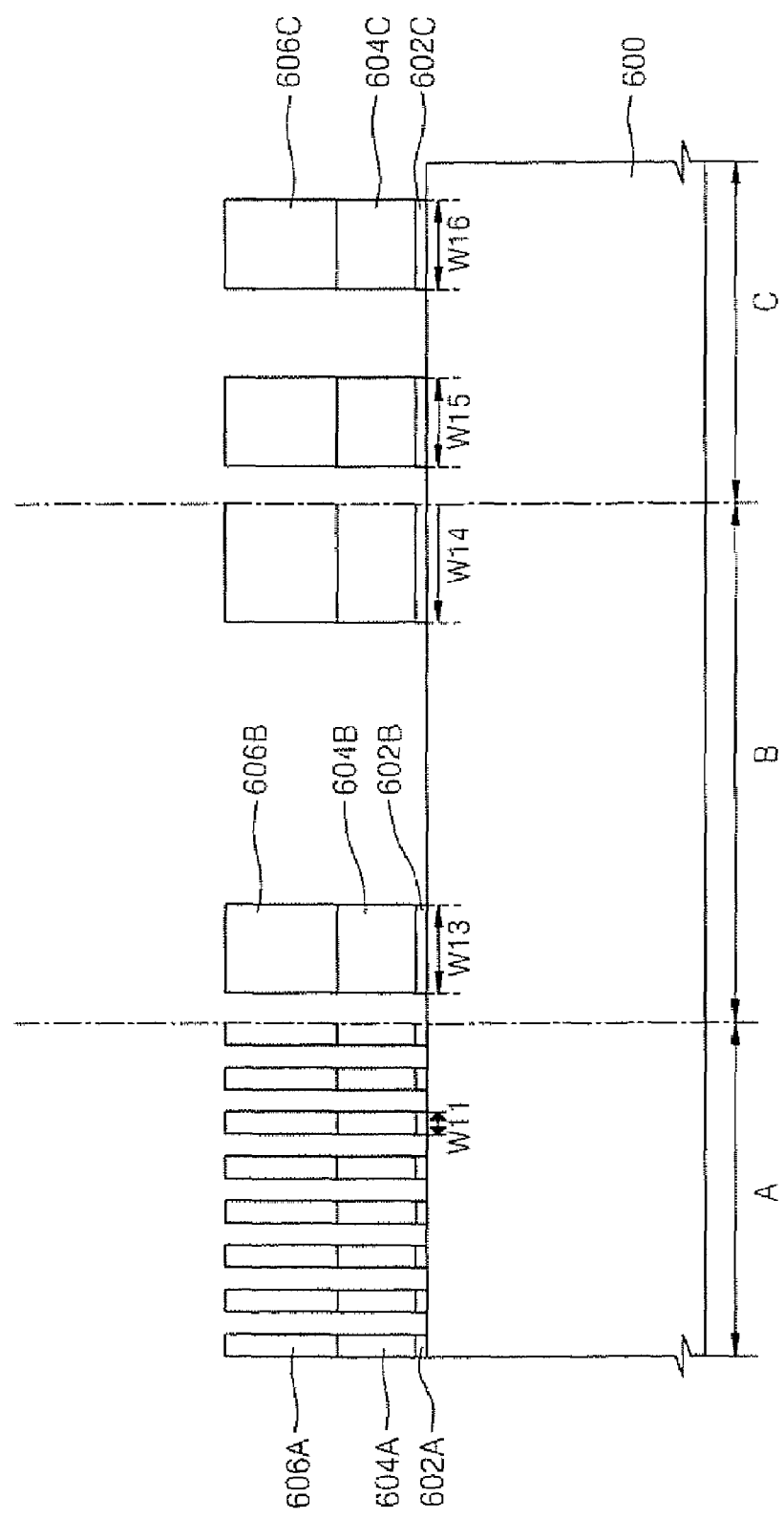

METHOD OF FORMING SEMICONDUCTOR DEVICE PATTERNS

CROSS-REFERENCE TO RELATED APPLICATIONS

This application claims the benefit of Korean Patent Application No. 10-2009-0001245, filed on Jan. 7, 2009, in the Korean Intellectual Property Office, the disclosure of which is incorporated herein in its entirety by reference.

BACKGROUND

The present invention relates generally to semiconductor devices, and more particularly, to methods of manufacturing semiconductor devices.

With regard to the fabrication of a highly integrated nanoscale semiconductor device, a new technology for simultaneously forming various patterns with the number of times of photolithography processes reduced may be necessary in order to form patterns of a semiconductor device by simultaneously using narrow-width patterns having fine widths and fine pitches and wide-width patterns having relatively large widths. In addition, a semiconductor device having a new arrangement structure to which such a technology can be applied may be necessary.

SUMMARY

Embodiments of the present invention can provide methods of forming patterns of a semiconductor device to overcome problems of misalignment that may occur between patterns having various widths, including narrow-width patterns for forming high-density patterns and wide-width patterns, when the patterns having various widths are simultaneously formed.

According to embodiments of the present invention, there is provided a method of forming patterns of a semiconductor device. In the method, a first mold mask pattern and a second mold mask pattern, having different widths, may be formed on a substrate. A pair of first spacers covering both sidewalls of the first mold mask pattern and a pair of second spacers covering both sidewalls of the second mold mask pattern may be formed. The first mold mask pattern and the second mold mask pattern may be removed so as to expose the substrate through a first gap between the pair of first spacers and through a second gap between the pair of second spacers. A wide-width mask pattern covering an internal space of the second gap and the second spacer may be formed. The substrate may be etched by using the first spacers, the second spacers, and the wide-width mask pattern as an etch mask.

The wide-width mask pattern may be formed so as to completely fill the internal space of the second gap. The wide-width mask pattern may have a width that is less than a distance between outermost sidewalls of the pair of second spacers, and may be formed so as to cover the pair of second spacers. In addition, after the wide-width mask pattern is formed, outermost sidewalls of the pair of second spacers may be exposed around both sidewalls of the wide-width mask pattern.

The wide-width mask pattern may be formed so as to cover only one of the pair of second spacers.

In a method of forming patterns of a semiconductor device, according to embodiments of the present invention, the substrate may include a semiconductor substrate, and an etched layer formed on the semiconductor substrate. The etching of the substrate may include etching the etched layer so as to simultaneously form a first pattern and a second pattern having different widths. The substrate may include a memory cell region, the first pattern may be a first conductive line formed in the memory cell region, and the second pattern may be a second conductive line adjacent to the first conductive line.

In a method of forming patterns of a semiconductor device, according to embodiments of the present invention, the substrate may include a semiconductor substrate, and an etched layer formed on the semiconductor substrate. In addition, the etching of the substrate may include etching the etched layer so as to simultaneously form a first pattern and a second pattern having different widths, and etching the substrate by using the first pattern and the second pattern as an etch mask so as to form a plurality of trenches in the substrate.

According to other embodiments of the present invention, there is provided a method of forming patterns of a semiconductor device. In the method, a hard mask layer may be formed on a substrate including a first region and a second region. A plurality of narrow-width mold mask patterns may be formed on the hard mask layer in the first region, and a plurality of wide-width mold mask patterns may be formed on the hard mask layer in the second region. A plurality of first spacers covering sidewalls of each of the plurality of narrow-width mold mask patterns, and a plurality of second spacers covering sidewalls of each of the plurality of wide-width mold mask patterns may be simultaneously formed. The plurality of narrow-width mold mask patterns and the plurality of wide-width mold mask patterns may be removed in the first region and the second region. A wide-width mask pattern covering portions of the plurality of second spacers may be removed in the second region. The hard mask layer may be etched by using the plurality of first spacers, the plurality of second spacers and the wide-width mask pattern as an etch mask so as to form a plurality of hard mask patterns including a narrow-width hard mask pattern and a wide-width hard mask pattern.

BRIEF DESCRIPTION OF THE DRAWINGS

Exemplary embodiments of the present invention will be more clearly understood from the following detailed description, taken in conjunction with the accompanying drawings in which:

FIGS. 6A through 6I are cross-sectional views for describing a method of forming patterns of a semiconductor device, according to another embodiment of the present invention.

DETAILED DESCRIPTION

Figure 1:
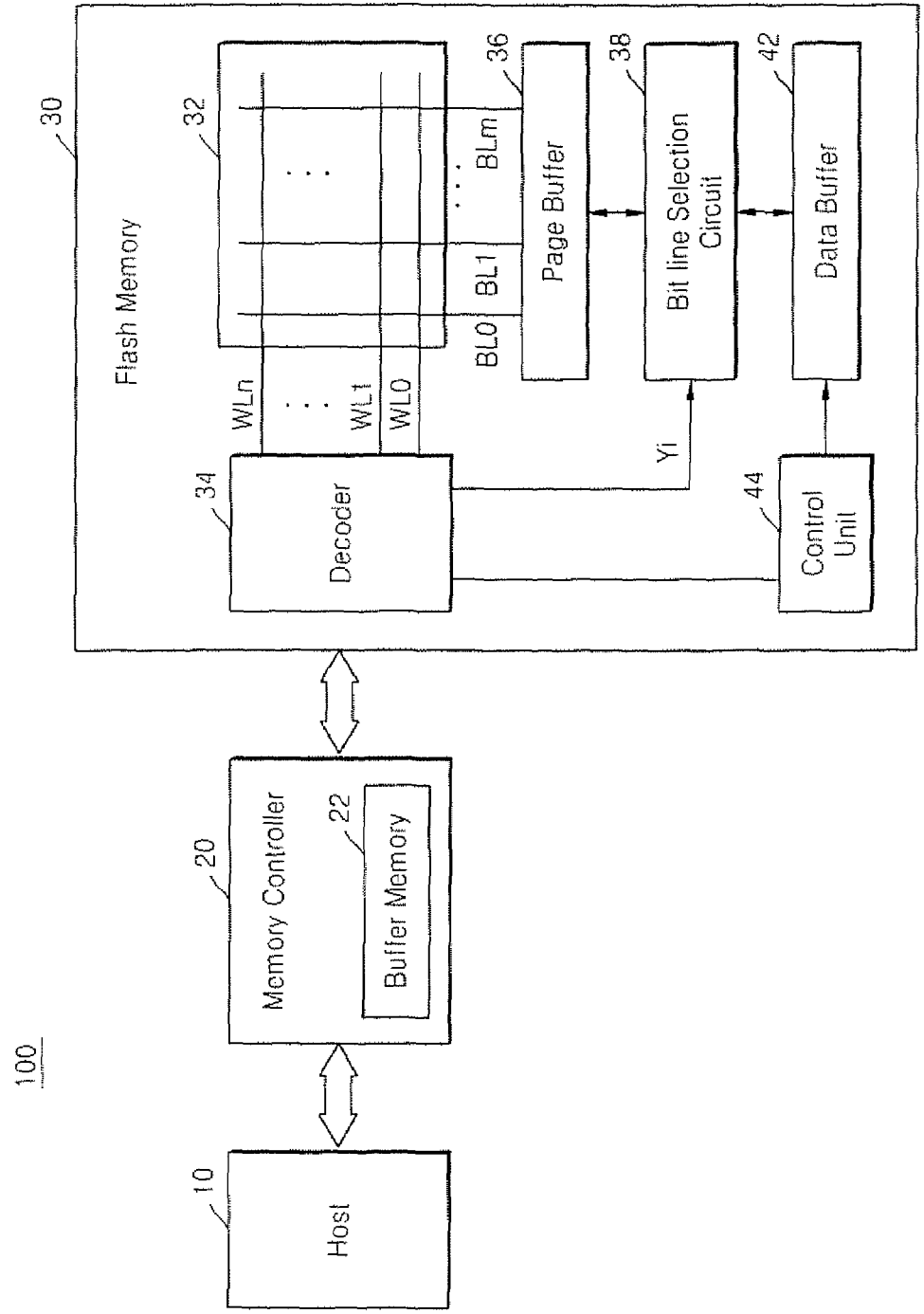
FIG. 1 is a block diagram of a memory system of a semiconductor device that can be realized by a method of forming patterns of a semiconductor device according to an embodiment of the present invention.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a block diagram of a memory system 100 of a semiconductor device that can be realized by a method of forming patterns of a semiconductor device according to an embodiment of the present invention.

Referring to FIG. 1, the memory system 100 of a semiconductor device includes a host 10, a memory controller 20, and a flash memory 30.

The memory controller 20 functions as an interface between the host 10 and the flash memory 30, and includes a buffer memory 22. Although not illustrated in FIG. 1, the memory controller 20 may further include a central processing unit (CPU), a read only memory (ROM), a random access memory (RAM), and interface blocks, as would be understood by one skilled in the art of the present invention.

The flash memory 30 may further include a cell array 32, a decoder 34, a page buffer 36, a bit line selection circuit 38, a data buffer 42, and a control unit 44.

A write command is input from the host 10 to the memory controller 20. Then, the memory controller 20 controls the flash memory 30 so that data may be written to the cell array 32 according to the write command input. In addition, the memory controller 20 controls the flash memory 30 so as to read data stored in the cell array 32 according to a read command input from the host 10. The buffer memory 22 temporarily stores data transferred between the host 10 and the flash memory 30.

The cell array 32 of the flash memory 30 includes a plurality of memory cells. The decoder 34 is connected to the cell array 32 through word lines WL0, WL1, through WLn, where n is a natural number. The decoder 34 receives an address from the memory controller 20, and then selects one of the word lines WL0, WL1, through WLn, or generates a selection signal Yi so as to select bit lines BL0, BL1, through BLm. The page buffer 36 is connected to the cell array 32 through the bit lines BL0, BL1, through BLm.

Figure 2:
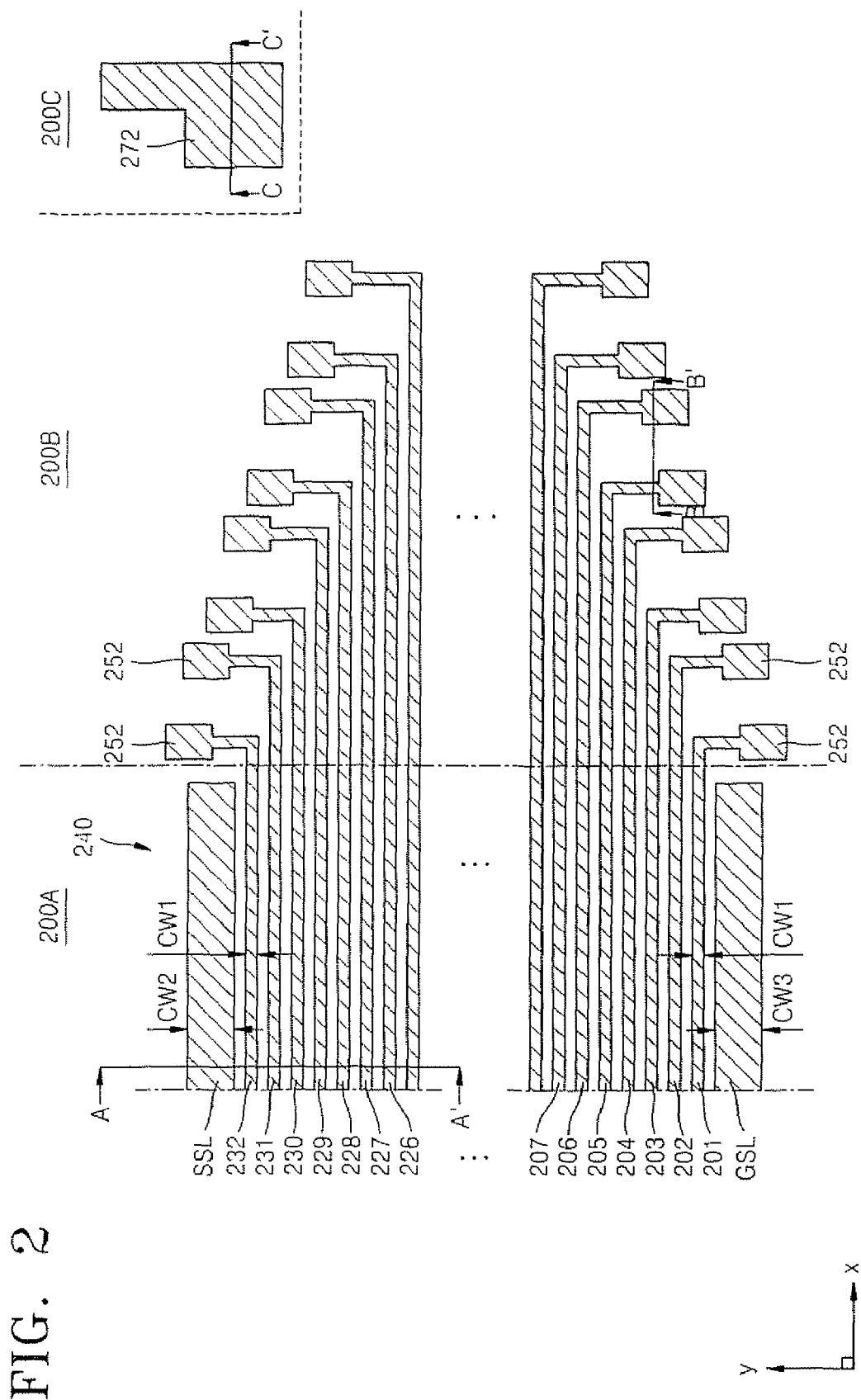
FIG. 2 is a plan view partially illustrating a memory device that can be realized by a method of forming patterns of a semiconductor device according to an embodiment of the present invention.

FIG. 2 is a plan view partially illustrating a memory device that can be realized by a method of forming patterns of a semiconductor device according to an embodiment of the present invention. That is, FIG. 2 is a layout illustrating a portion of a memory cell region 200A of a NAND flash memory device, a portion of a connection region 200B for connecting a plurality of conductive lines constituting a cell array of the memory cell region 200A, such as a word line or a bit line, to an external circuit (not shown) such as a decoder, and a portion of a peripheral circuit region 200C.

Referring to FIG. 2, a plurality of memory cell blocks 240 are formed on the memory cell region 200A; however, a single memory cell block 240 is illustrated. In the memory cell block 240, a plurality of conductive lines 201, 202, through 232 that form a single cell string extend between a string selection line SSL and a ground selection line GSL in parallel to one another. The conductive lines 201, 202, through 232 extend across the memory cell region 200A and the connection region 200B.

In order to connect the conductive lines 201, 202, through 232 to an external circuit (not shown) such as a decoder, in the connection region 200B, a plurality of contact pads 252 are formed at ends of the conductive lines 201, 202, through 232 to be integrated to the conductive lines 201, 202, through 232, respectively. Embodiments of the present invention are not limited to the shape of the contact pads 252 illustrated in FIG. 2, and thus the contact pads 252 may have various shapes, as necessary.

A peripheral circuit conductive pattern 272 is formed on the peripheral circuit region 200C.

In FIG. 2, the conductive lines 201, 202, through to 232, the string selection line SSL, the ground selection line GSL, the contact pads 252, and the peripheral circuit conductive pattern 272 may be formed of the same material. The conductive lines 201, 202 through to 232 may be word lines needed for a plurality of memory cells in the memory cell region 200A. The peripheral circuit conductive pattern 272 may constitute a gate electrode of a peripheral circuit transistor. The string selection line SSL and the ground selection line GSL may have widths W2 and W3, respectively, that are each greater than a width W1 of each of the conductive lines 201, 202, through to 232.

As another example, the conductive lines 201, 202, through 232 may be bit lines needed for memory cells in the memory cell region 200A. In this case, the string selection line SSL and the ground selection line GSL may be omitted.

In FIG. 2, the memory cell block 240 includes 32 conductive lines, that is, the conductive lines 201, 202, through 232. However, the memory cell block 240 may include various numbers of conductive lines without departing from the spirit and scope of embodiments of the present invention.

A method of forming patterns of a semiconductor device will now be described.

FIGS. 3A through 3J are cross-sectional views for describing a method of forming patterns of a semiconductor device, according to an embodiment of the present invention.

FIGS. 4A through 4H are plan views illustrating layouts of main portions of FIGS. 3A through 3J, illustrating a method of manufacturing the semiconductor device of FIG. 2. FIGS. 4A through 4H illustrate only a portion of the memory cell block 240 (see FIG. 2).

FIGS. 3A through 3J are cross-sectional views taken along lines A-A', B-B', and C-C' of FIG. 2, according to the processing order of the method. The same elements in FIGS. 3A through 3J, and 4A through 4H as those in FIG. 2 are denoted by the same reference numerals, and a detailed description thereof will not be given. In FIGS. 3A through 3J, the memory cell region 200A is denoted by "CELL", the connection region 200B is denoted by "CONTACT", and the peripheral circuit region 200C is denoted by "PERI".

Figure 3A:
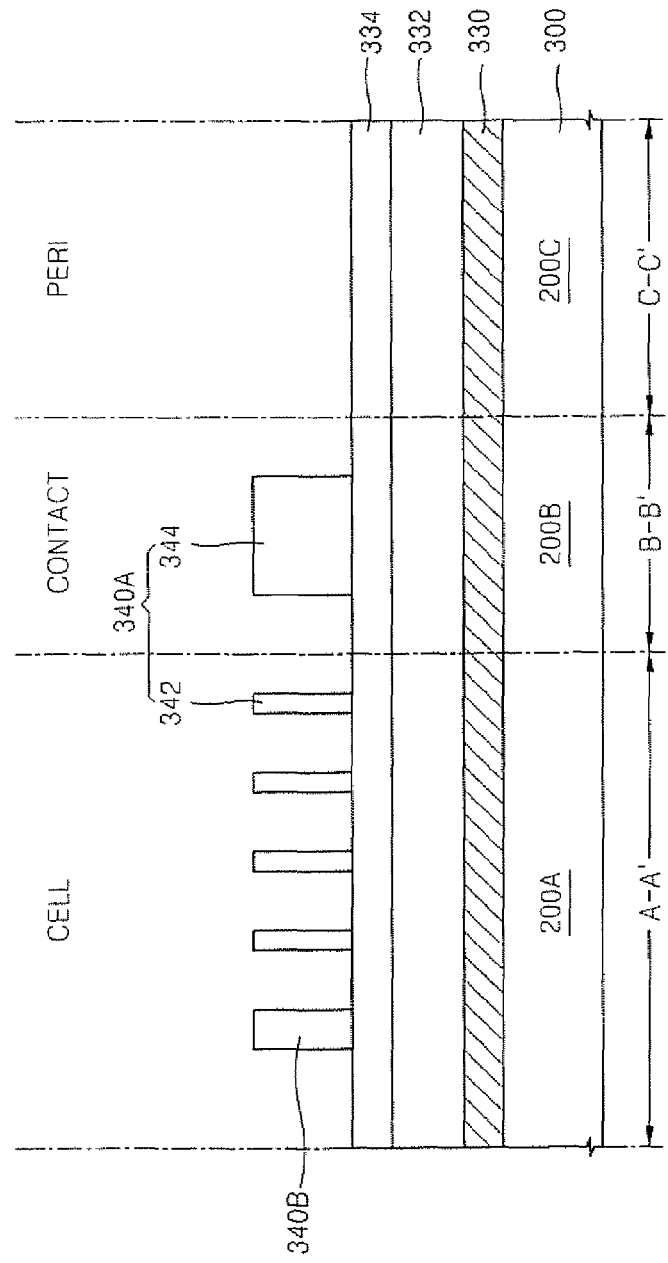
FIGS. 3A through 3J are cross-sectional views for describing a method of forming patterns of a semiconductor device, according to embodiments of the present invention.
Figure 4A:
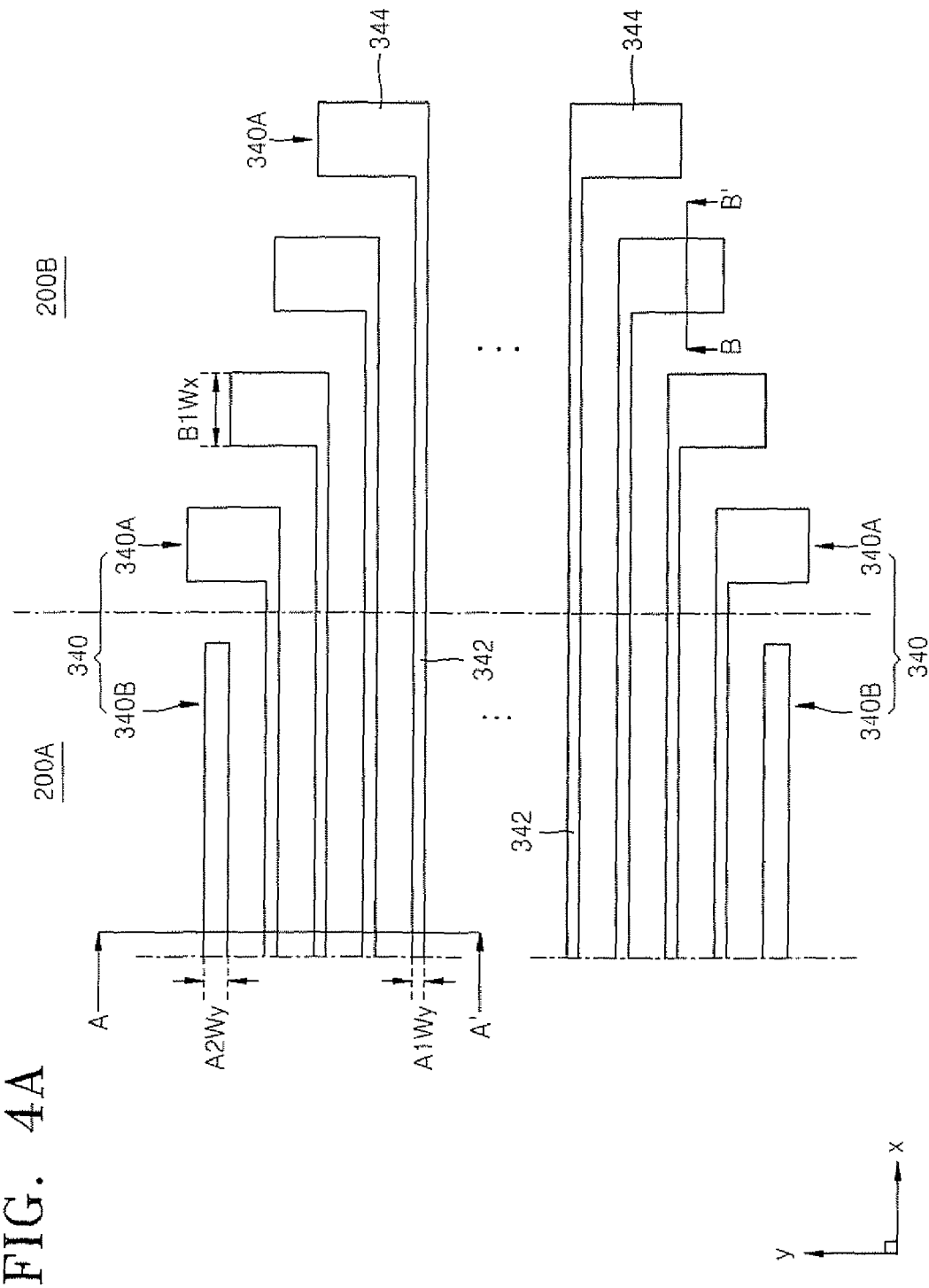
FIGS. 4A through 4H are plan views illustrating layouts of main portions of FIGS. 3A through 3J.

Referring to FIGS. 3A and 4A, a substrate 300 having the memory cell region 200A, the connection region 200B, and the peripheral circuit region 200C is prepared. The substrate 300 may be a silicon substrate.

A conductive layer 330 required to form conductive lines is formed on the substrate 300, and then a first hard mask layer 332 and a second hard mask layer 334 are sequentially formed on the conductive layer 330 in the order stated. If necessary, one of the first hard mask layer 332 and the second hard mask layer 334 may be omitted. In addition, another layer, in addition to the first hard mask layer 332 and the second hard mask layer 334, may be formed.

Then, in the memory cell region 200A and the connection region 200B, a plurality of mold mask pattern blocks 340 are formed on the second hard mask layer 334. In FIG. 3A, a single mold mask pattern block 340 required to form the memory cell block 240 (see FIG. 2) is illustrated. The mold mask pattern block 340 includes a plurality of first mold mask patterns 340A that extend across the memory cell region 200A and the connection region 200B, and a plurality of second mold mask patterns 340B formed only in the memory cell region 200A.

When a word line is formed from the conductive layer 330, the conductive layer 330 may include a stack structure in which a tunneling oxide layer, a charge storage layer, a blocking oxide layer, and a gate electrode layer are sequentially formed on the substrate 300 in the order stated. In this case, the tunneling oxide layer may be a silicon oxide layer. The charge storage layer may be a silicon nitride layer, or a high-k film having a higher dielectric constant than that of the silicon nitride layer. For example, the charge storage layer may include a $Si_3N_4$ layer, a metal oxide layer, a metal nitride layer, or a combination thereof. The blocking oxide layer may be formed of any one selected from the group consisting of $Al_2O_3$, $SiO_2$, $HfO_2$, $ZrO_2$, LaO, LaAlO, LaHfO and HfAlO. The gate electrode layer may be formed of any one selected from the group consisting of TaN, TiN, W, WN, HfN and tungsten silicide, or a combination thereof. As another example, when a word line is formed from the conductive layer 330, the conductive layer 330 may include a stack structure in which a tunneling oxide layer, a floating gate conductive layer, an inter-gate dielectric layer, and a control gate conductive layer are sequentially formed on the substrate 300 in the order stated.

When a bit line is formed from the conductive layer 330, the conductive layer 330 may be formed of doped polysilicon or metal.

The first hard mask layer 332 may be an oxide layer, and the second hard mask layer 334 may be a polysilicon layer.

As illustrated in FIG. 4A, each of the first mold mask patterns 340A extending from the memory cell region 200A to the connection region 200B includes a first portion 342 extending across the memory cell region 200A and the connection region 200B in a first direction (the "x"-axis direction of FIG. 4A), and a second portion 344 that is formed only on the connection region 200B and extends in a different direction from the first direction, such as a second direction (the "y"-axis direction of FIG. 4A) perpendicular to the first direction. In each of the first mold mask patterns 340A, a width B1Wx of the second portion 344, measured in the x-axis direction, may be greater than a width A1Wy of the first portion 342, measured in the y-axis direction.

In the memory cell region 200A, a width A2Wy of the second mold mask pattern 340B, measured in the y-axis direction, may be greater than a width A1Wy of the first portion 342 of the first mold mask pattern 340A, measured in the y-axis direction.

When the second hard mask layer 334 is a polysilicon layer, the mold mask pattern block 340 may be formed of a material having an etch selectivity with respect to the second hard mask layer 334. For example, the mold mask pattern block 340 may be a carbon-containing layer (hereinafter, referred to as a "SOH layer"), an oxide layer, or a nitride layer. The SOH layer may be formed of a hydrocarbon compound including an aromatic ring such as phenyl, benzene, or naphthalene, or an organic compound including a derivative of the hydrocarbon compound. The SOH layer may be formed of an organic compound in which the amount of carbon is relatively high and is in the range of about 85 to about 99 wt % based on the total weight of the SOH layer, and may be formed using a spin coating method.

The first and second mold mask patterns 340A and 340B may be formed using an etching method in which a photoresist pattern (not shown) formed using a general photolithography process is used as an etch mask.

Referring to FIG. 33, a mask layer 350, covering an upper surface and sidewalls of each of the first and second mold mask patterns 340A and 340B, is formed on the resultant structure including the first and second mold masks patterns 340A and 340B.

The mask layer 350 may be formed so as to cover the upper surface and sidewalls of each of the first and second mold mask patterns 340A and 340B in a uniform thickness.

When the second hard mask layer 334 is a polysilicon layer, and each of the first and second mold mask patterns 340A and 340B is an SOH layer, the mask layer 350 may be an oxide layer.

Figure 3B:
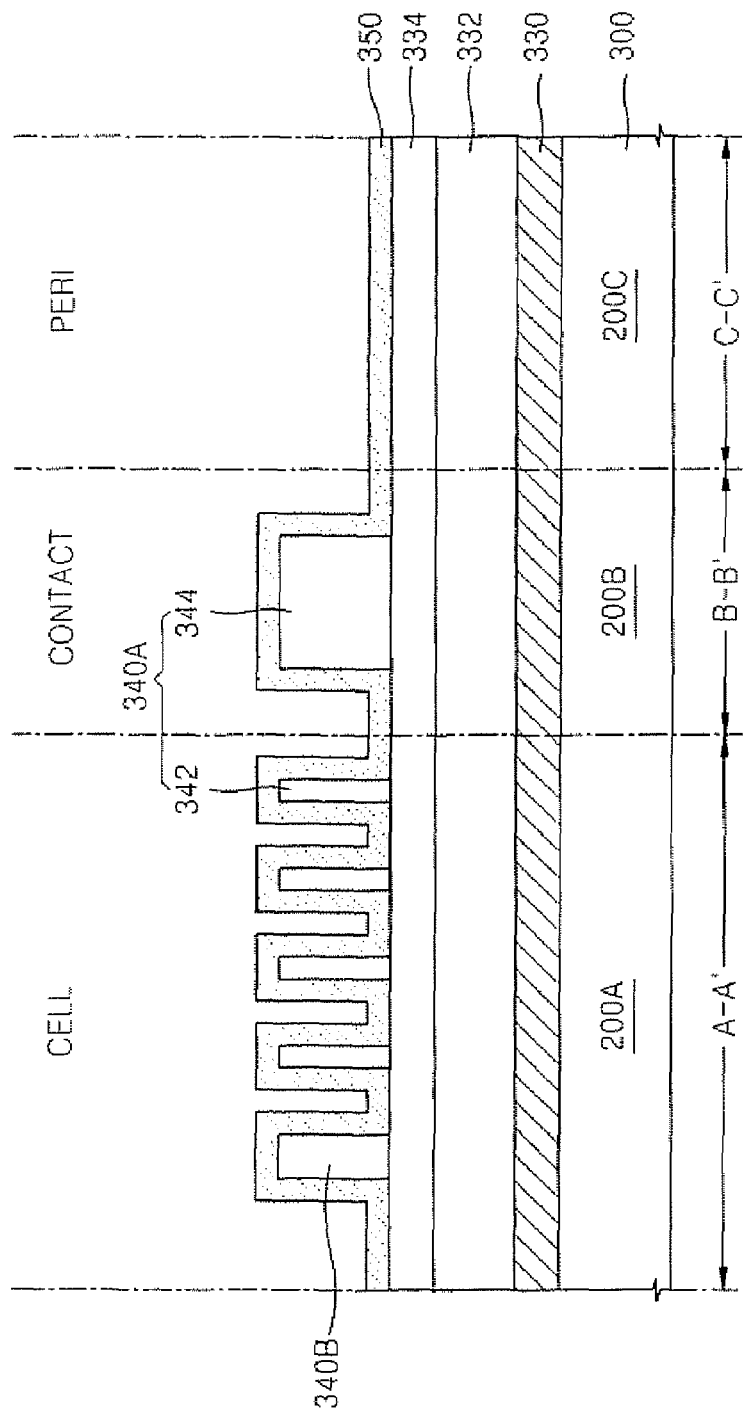
Figure 3C:
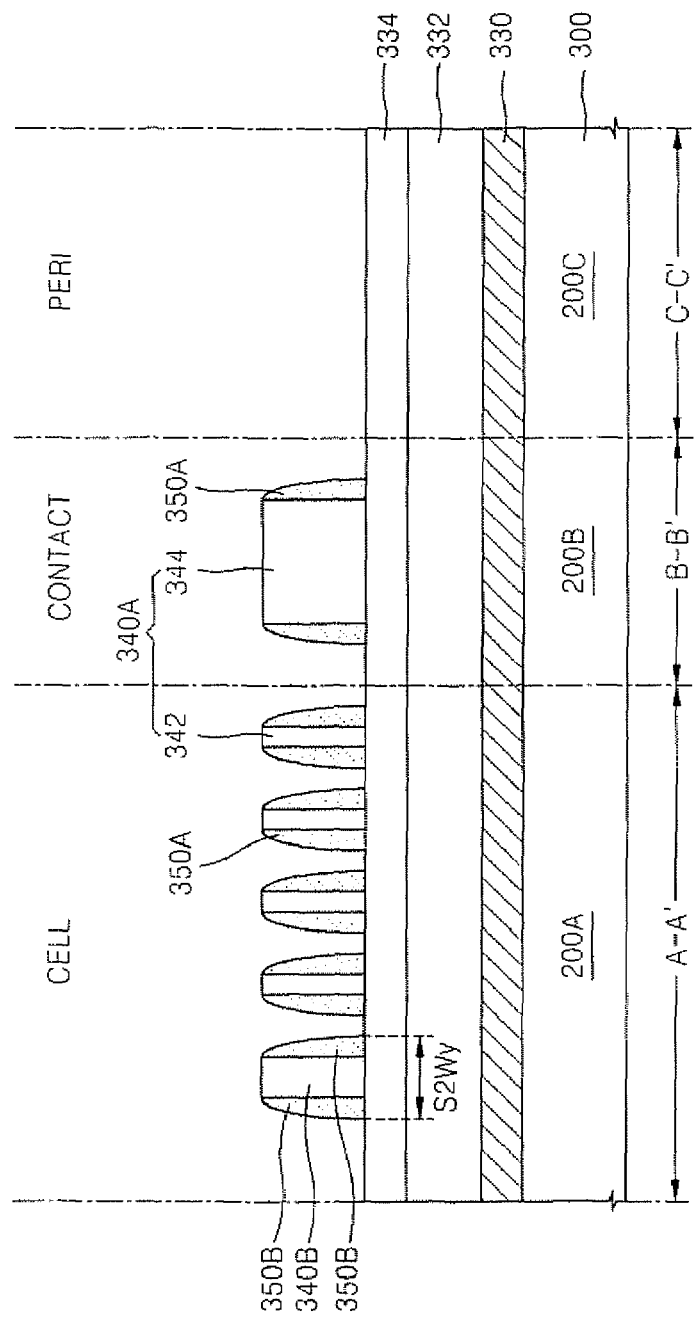
Figure 4B:
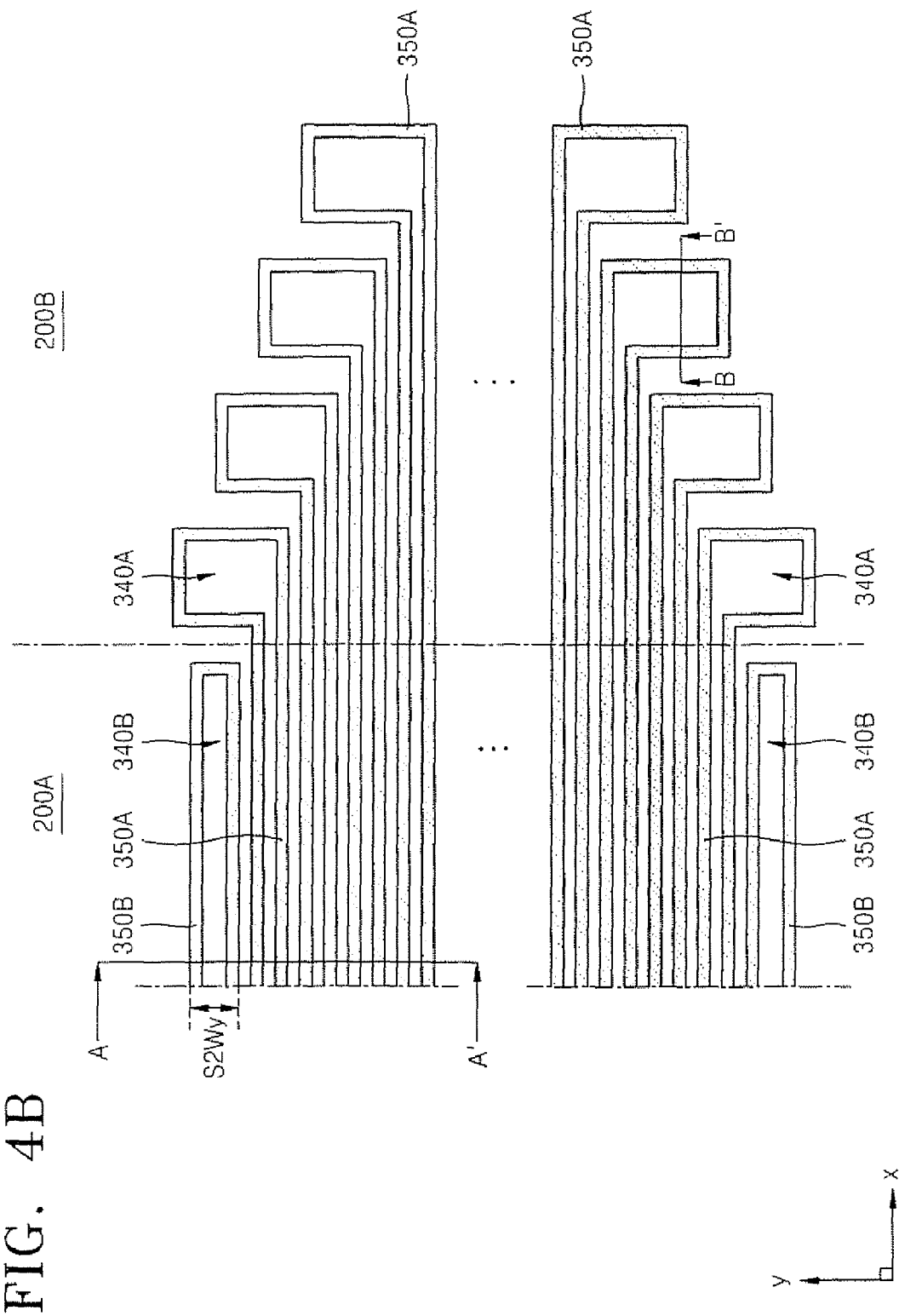

Referring to FIGS. 3C and 4B, in the memory cell region 200A and the connection region 200B, a plurality of first spacers 350A each having a loop shape and covering the sidewalls of each of the first mold mask patterns 340A, and a plurality of second spacers 350B each having a loop shape and covering the sidewalls of each of the second mold mask patterns 340B are formed by performing etch-back on the mask layer 350.

In the memory cell region 200A, a distance S2Wy, measured in the y-axis direction, between the outermost sidewalls of each of the second spacers 350B each having a loop shape and covering the sidewalls of each of the second mold mask patterns 340B may be equal to each of the widths CW2 and CW3 of the string selection line SSL and the ground selection line GSL (see FIG. 2) that are to be formed in the memory cell region 200A.

Figure 3D:
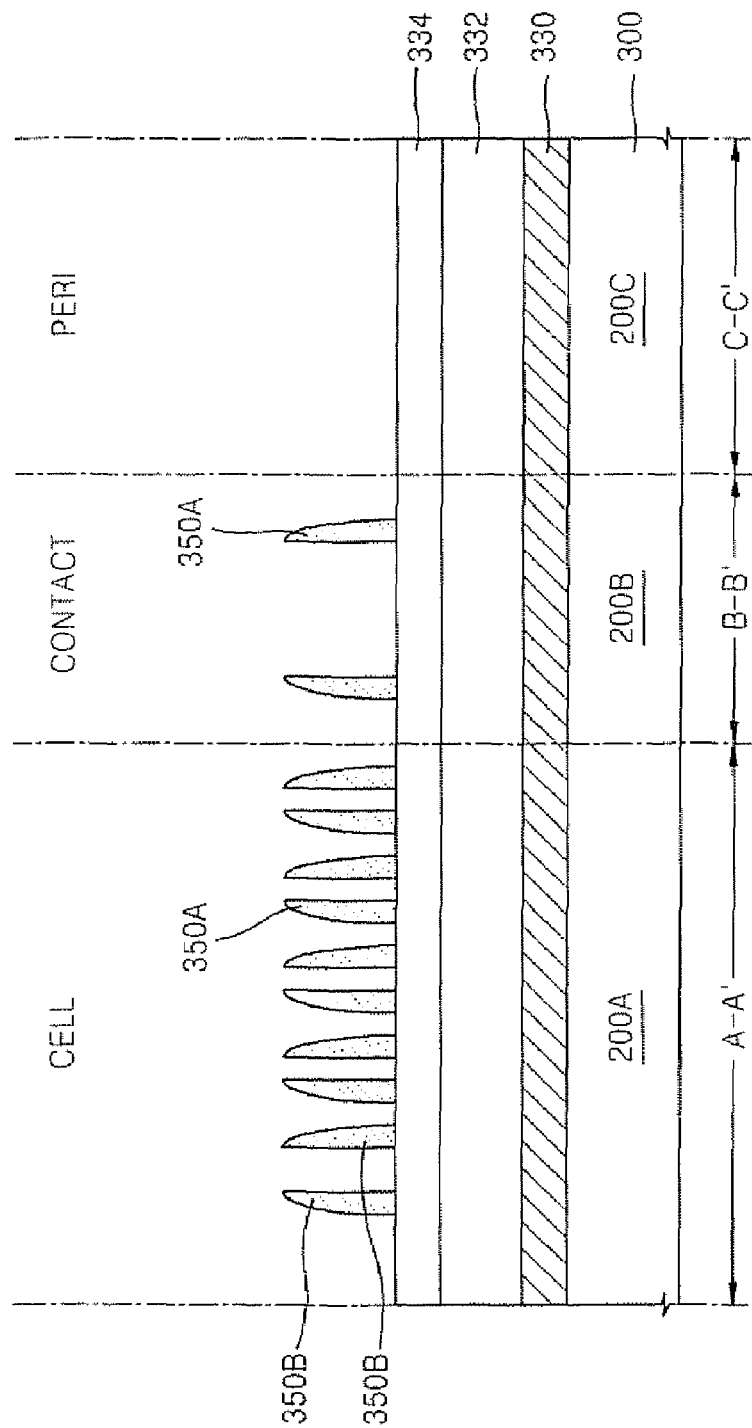
Figure 4C:
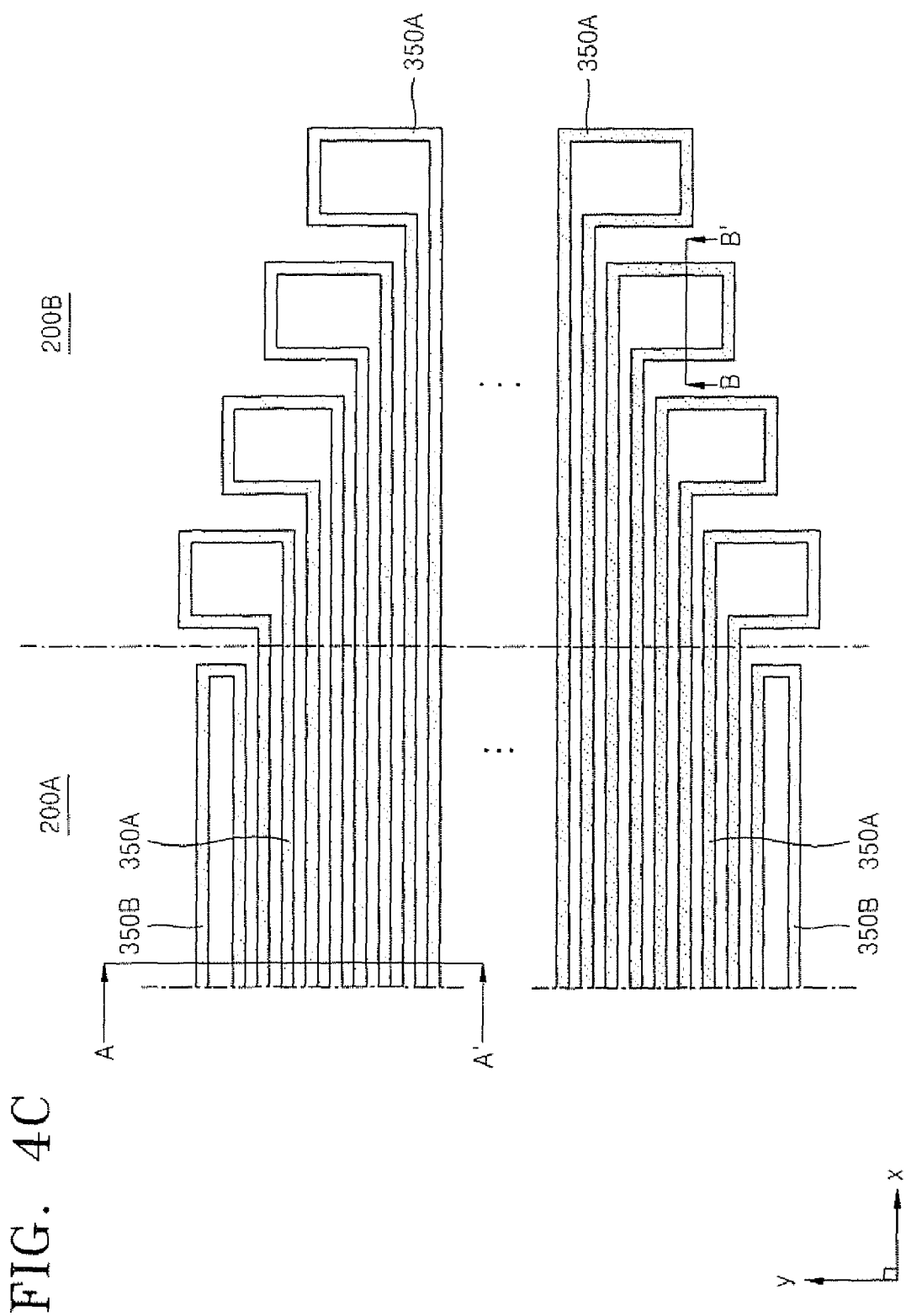

Referring to FIGS. 3D and 4C, in the memory cell region 200A and the connection region 200B, the first and second mold mask patterns 340A and 340B are removed so that portions of an upper surface of the second hard mask layer 334 are exposed though loops constituting the first and second spacers 350A and 350B.

Figure 3E:
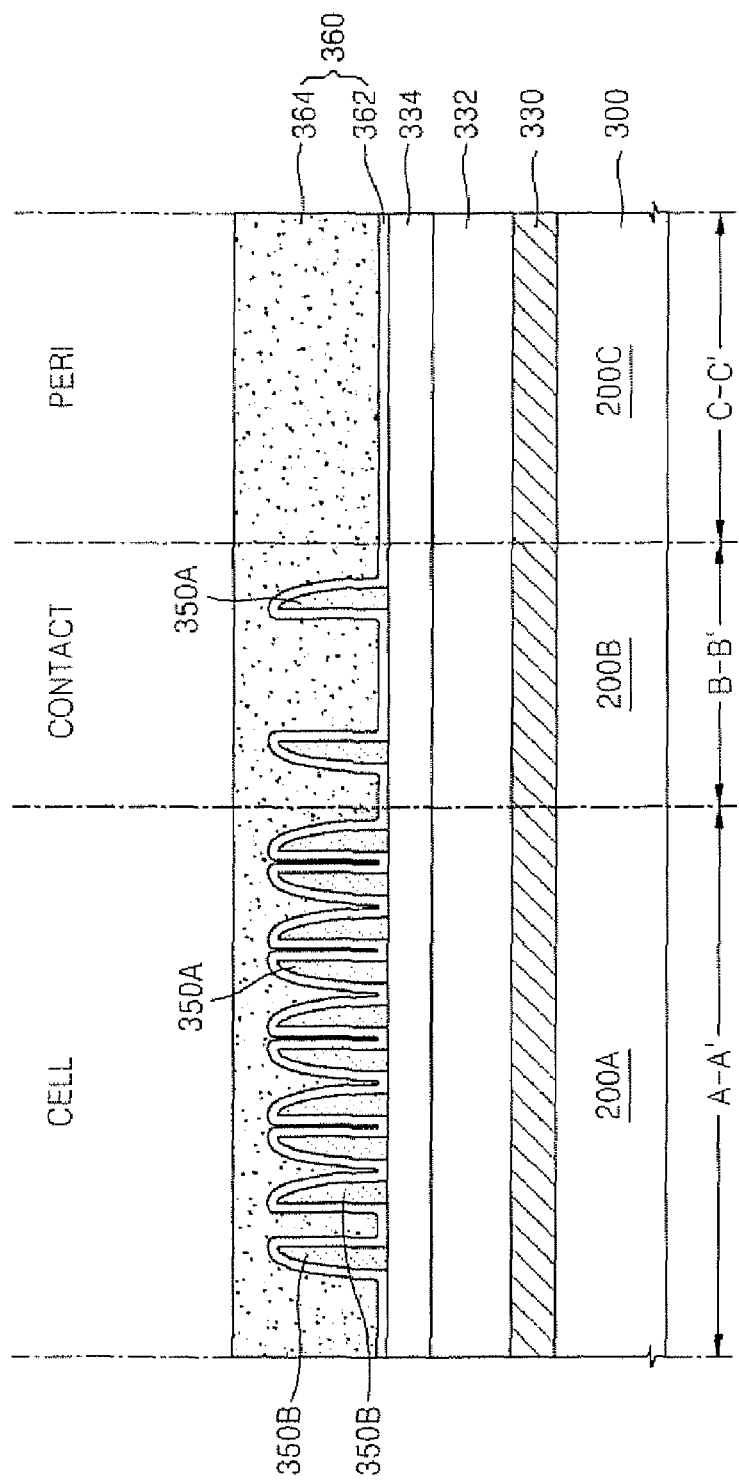
Figure 4D:
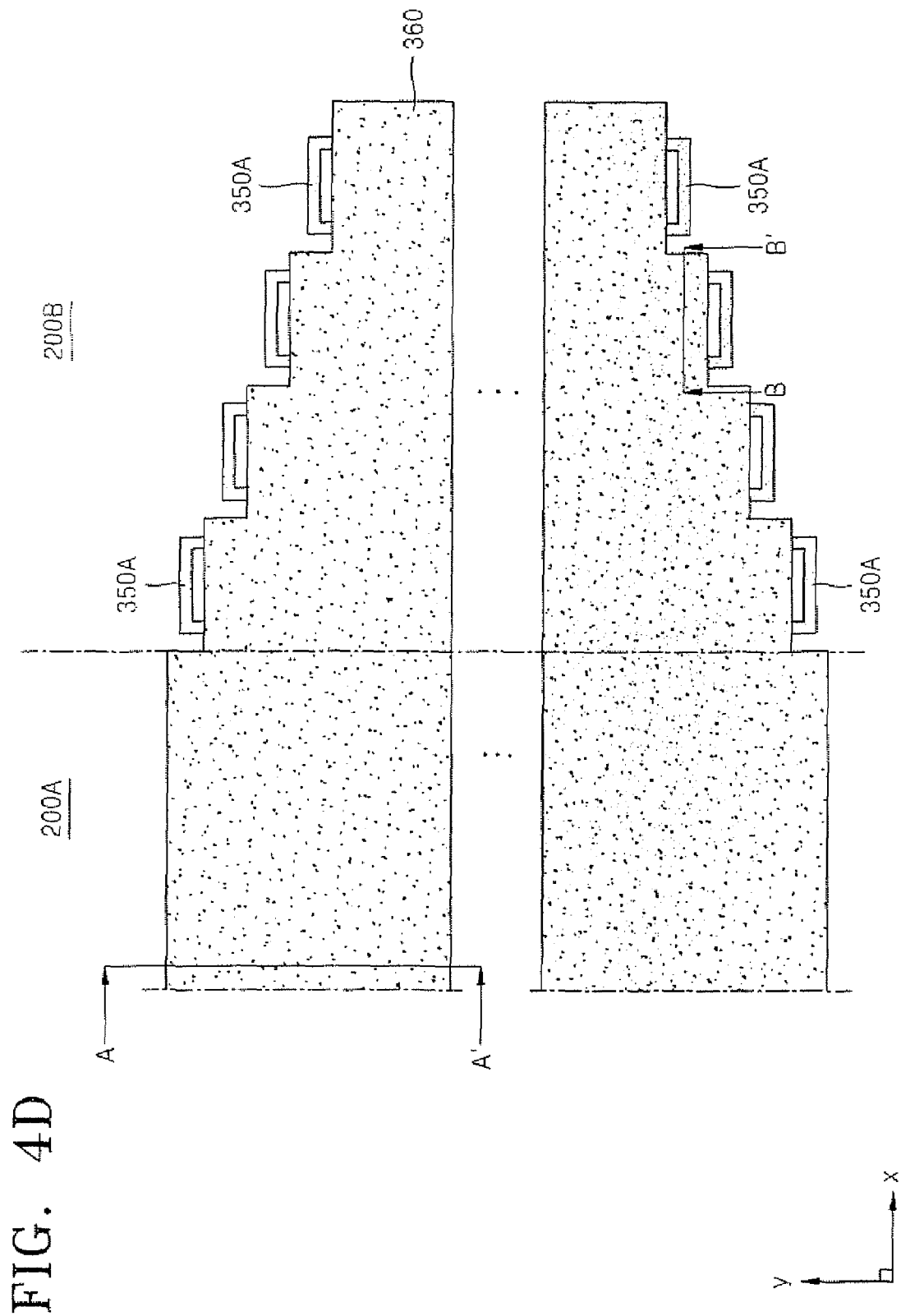

Referring to FIGS. 3E and 4D, a trimming mask pattern 360 is formed on the first and second spacers 350A and 350B, and the second hard mask layer 334.

After the trimming mask pattern 360 is formed, portions of the first spacers 350A are exposed to the outside around the trimming mask pattern 360, in the connection region 200B (see FIG. 2). Although not illustrated in FIGS. 3E and 4D, also in the memory cell region 200A, a portion of the first spacer 350A is exposed around the trimming mask pattern 360. On the other hand, the second spacer 350B of the memory cell region 200A is completely covered by the trimming mask pattern 360, and thus the second spacer 350B is not exposed to the outside.

The trimming mask pattern 360 may include a developable bottom anti-reflective coating film (DBARC) layer 362 covering the first and second spacers 350A and 350B, and a photoresist pattern 364 covering the DBARC layer 362.

Figure 3F:
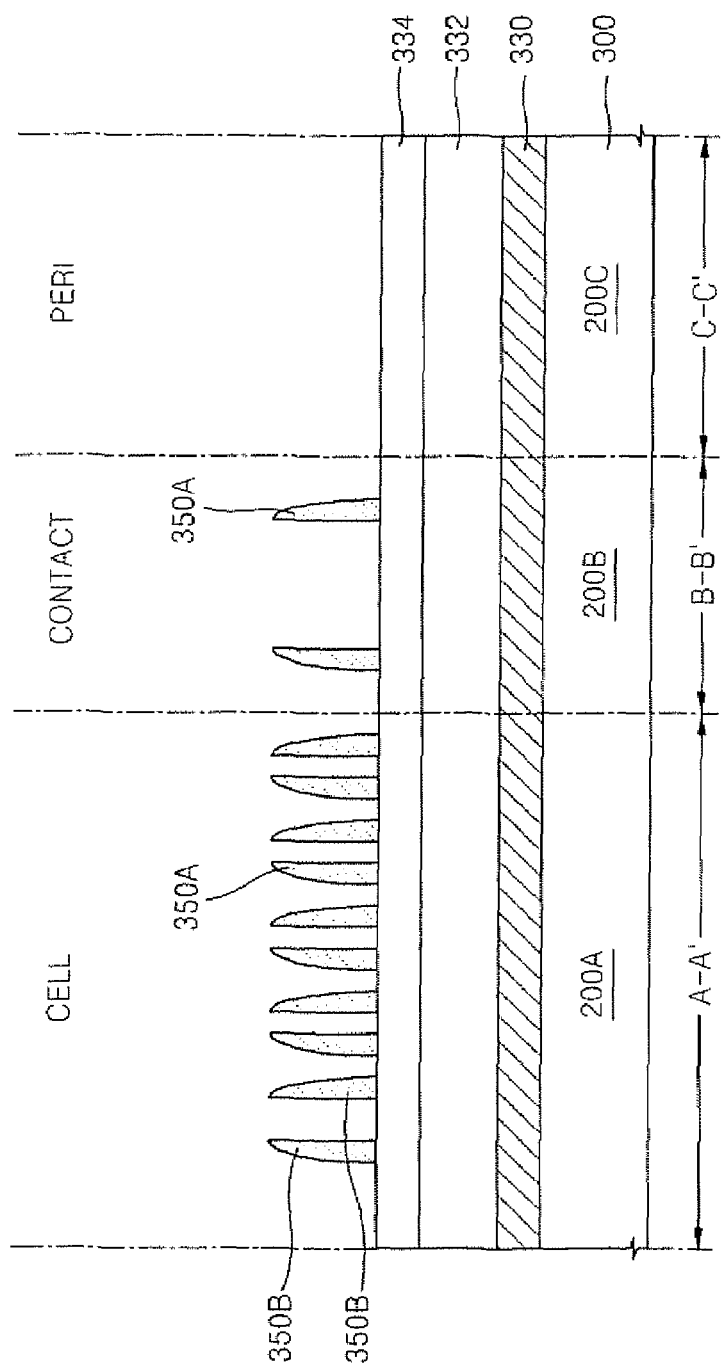
Figure 4E:
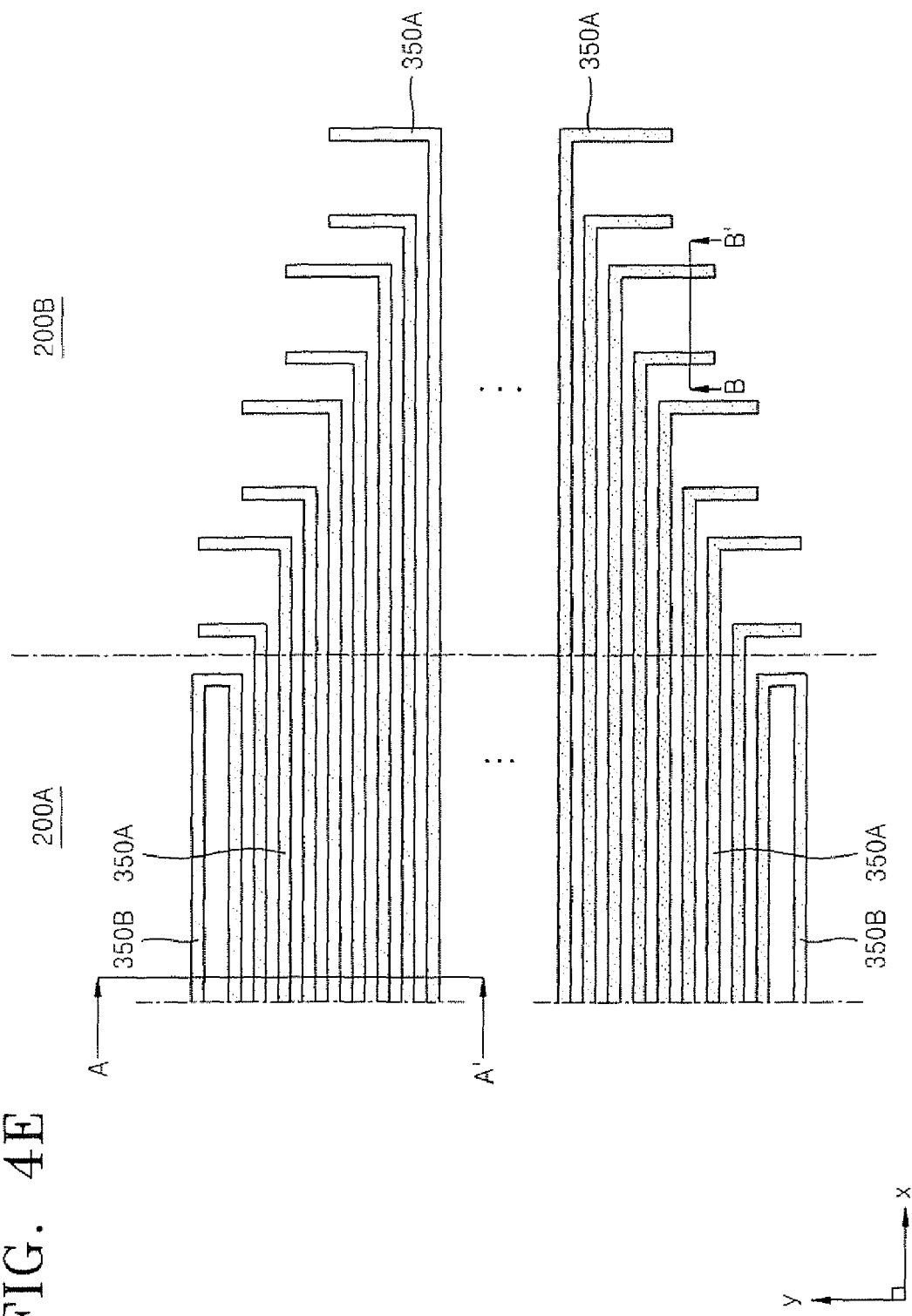

Referring to FIGS. 3F and 4E, a trimming process of etching exposed portions of the first spacers 350A is performed on the memory cell region 200A and the connection region 200B by using the trimming mask pattern 360 as an etch mask. As a result, in the memory cell region 200A and the connection region 200B of the substrate 300, the first spacer 350A, which had a loop shape, are divided into two parts.

Then, the trimming mask pattern 360 is removed. At this time, when the trimming mask pattern 360 includes the DBARC layer 362 and the photoresist pattern 364, the DBARC layer 362 may also be removed together with the photoresist pattern 364 by performing a developing operation. Thus, in the memory cell region 200A and the connection region 200B, even if an interval between the first spacers 350A is too narrow, a residue of the DBARC layer 362 does not remain between the first spacers 350A, and the DBARC layer 362 can be completely removed.

Figure 3G:
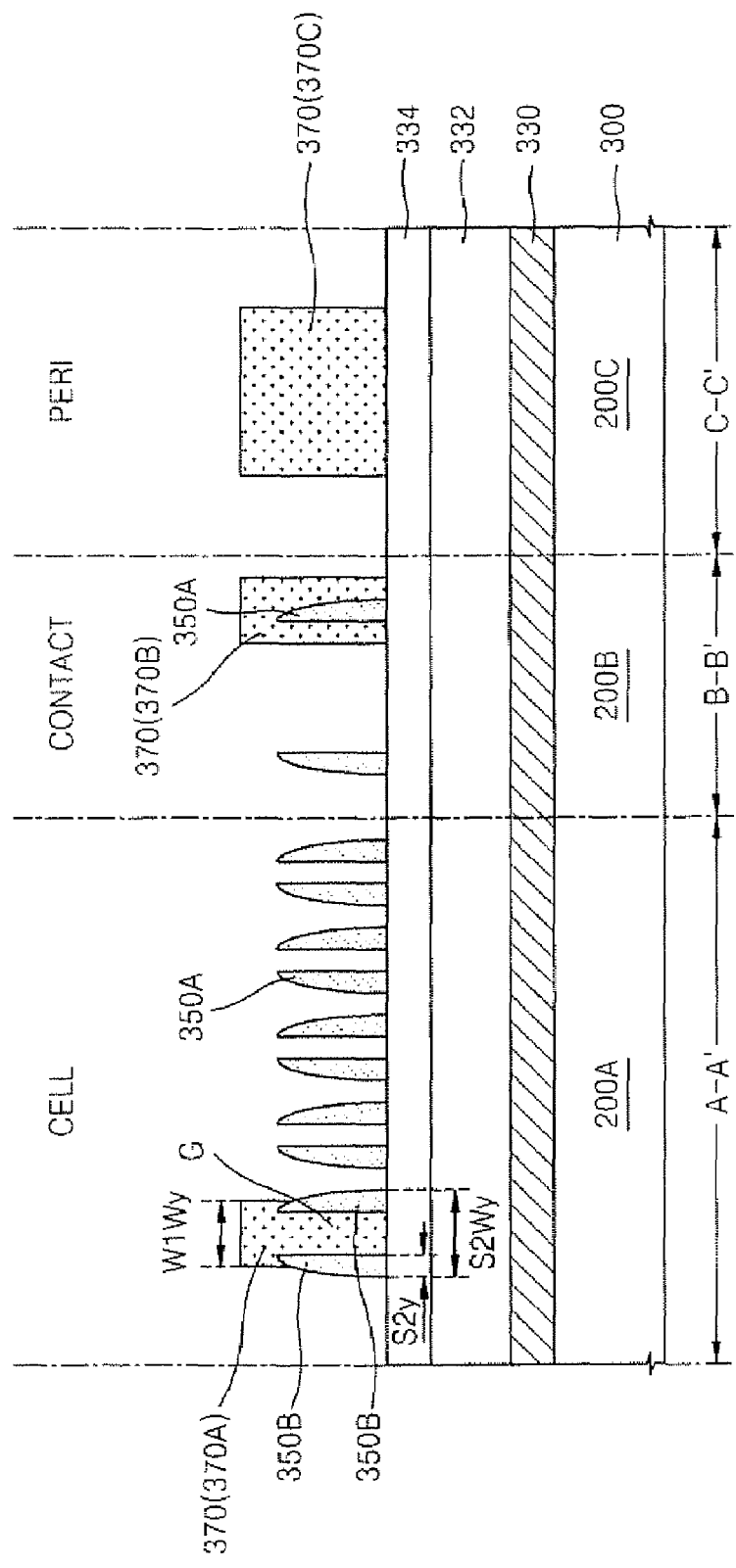
Figure 4F:
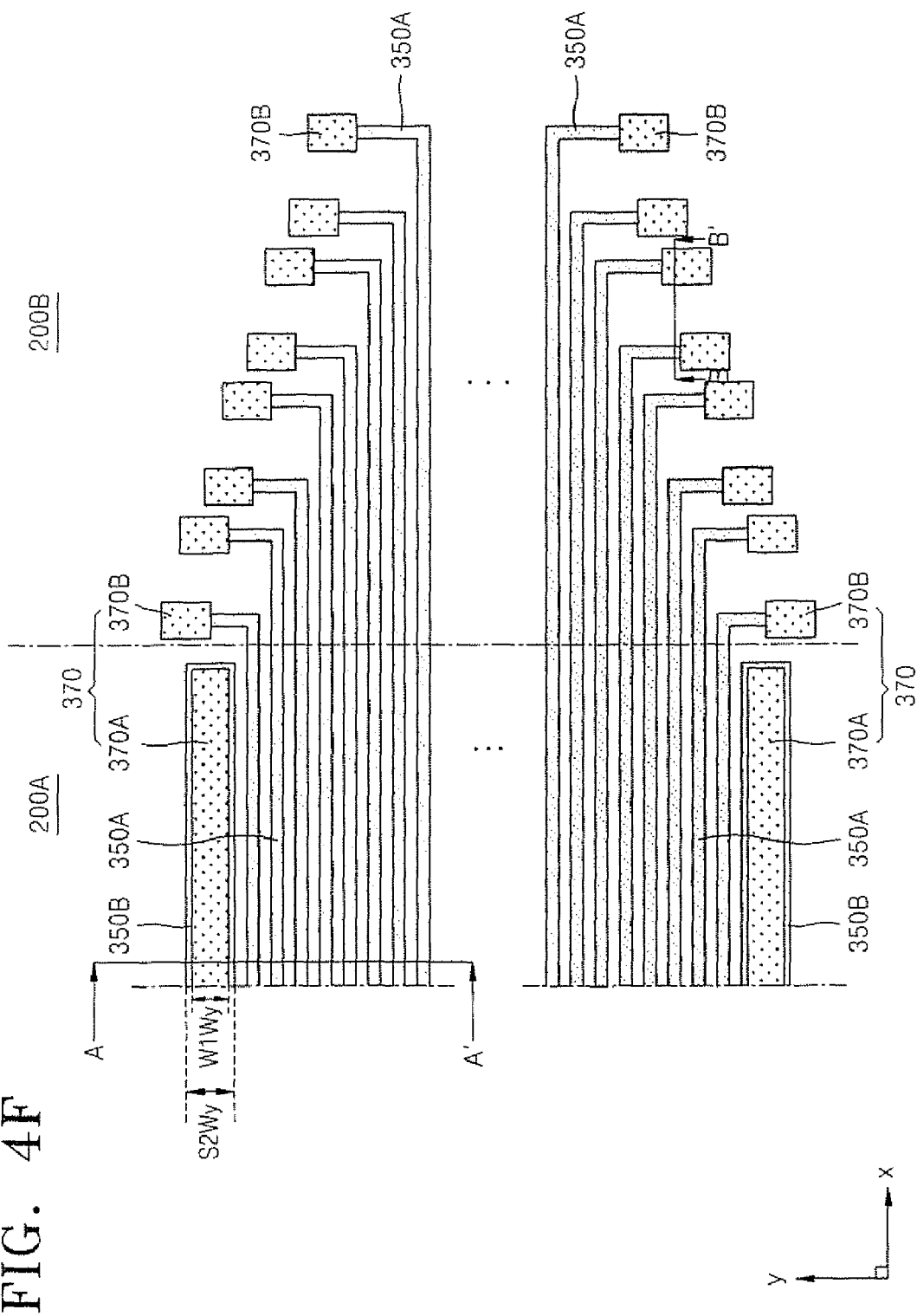

Referring to FIGS. 3G and 4F, a wide-width pattern mask layer 370 is formed on the resultant structure including the first and second spacers 350A and 350B, and then, a wide-width mask pattern 370 covering a portion for the formation of a wide-width pattern is formed by patterning the resulting structure.

The wide-width mask pattern 370 may include a first wide-width mask pattern 370A filling an internal space of the second spacers 350B and formed on the second spacers 350B in order to form the string selection line SSL and the ground selection line GSL (see FIG. 2) in the memory cell region 200A. The wide-width mask pattern 370 may include a second wide-width mask pattern 370B formed on the first spacer 350A in order to form the contact pads 252 (see FIG. 2) in the connection region 200B. In addition, the wide-width mask pattern 370 may include a third wide-width mask pattern 370C formed on the second hard mask layer 334 in the peripheral circuit region 200C in order to form the peripheral circuit conductive pattern 272 (see FIG. 2).

A width W1Wy of the first wide-width mask pattern 370A, measured in the y-axis direction, may be equal to or less than the distance S2Wy, measured in the y-axis direction, between the outermost sidewalls of a pair of second spacers 350B. In FIGS. 3G and 4F, the width W1Wy of the first wide-width mask pattern 370A, measured in the y-axis direction, is less than the distance S2Wy, measured in the y-axis direction, between the outermost sidewalls of the pair of second spacers 350B. Thus, the outermost sidewalls of the pair of second spacers 350B are exposed around both sidewalls of the first wide-width mask pattern 370A.

The wide-width mask pattern 370 may be formed using a photolithography process.

During the photolithography process for patterning the wide-width mask pattern 370, since the first wide-width mask pattern 370A is formed on the second spacers 350B so as to fill the internal space of the second spacers 350B, a processing margin can be obtained as much as a width S2y of the second spacer 350B, measured in the y-axis direction. In particular, since the processing margin is obtained by the second spacer 350B when controlling exposure dose during a developing operation, even if the width W1Wy of the first wide-width mask pattern 370A, measured in the y-axis direction, is outside a desired dimension, the first wide-width mask pattern 370A can fill a gap G defined by the second spacers 250B. Thus, the second hard mask layer 334 is not exposed through the gap G.

As an example, the wide-width mask pattern 370 may include a stack structure including an SOH layer having a planarized upper surface and a SiON layer covering the SOH layer. As another example, the wide-width mask pattern 370 may include a DBARC layer and a photoresist pattern covering the DBARC layer.

For example, in order to form the wide-width mask pattern 370, a wide-width mask layer, including a DBARC layer and a photoresist layer, is formed by forming the DBARC layer covering exposed portions of the first and second spacers 350A and 350B and the second hard mask layer 334 and then, forming the photoresist layer on the DBARC layer, and then the wide-width mask layer is patterned using a photolithography process. At this time, even if an interval between the first spacers 350A formed in the memory cell region 200A is too narrow, the DBARC layer covering the first spacer 350A can be removed together with a portion of the photoresist layer, which is subject to removal during a developing operation of the photoresist layer. Thus, a residue of the DBARC layer does not remain between the first spacers 350A formed on the memory cell region 200A, and the DBARC layer can be completely removed.

Figure 3H:
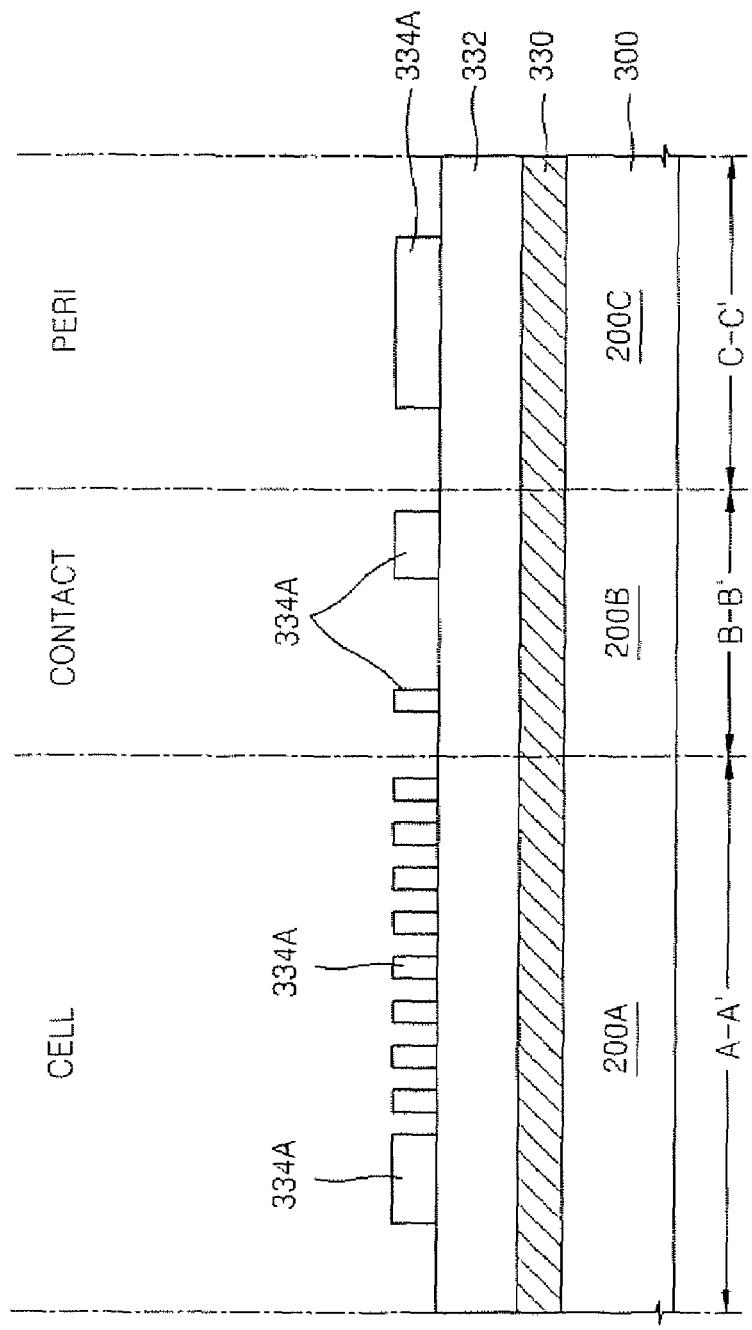
Figure 4G:
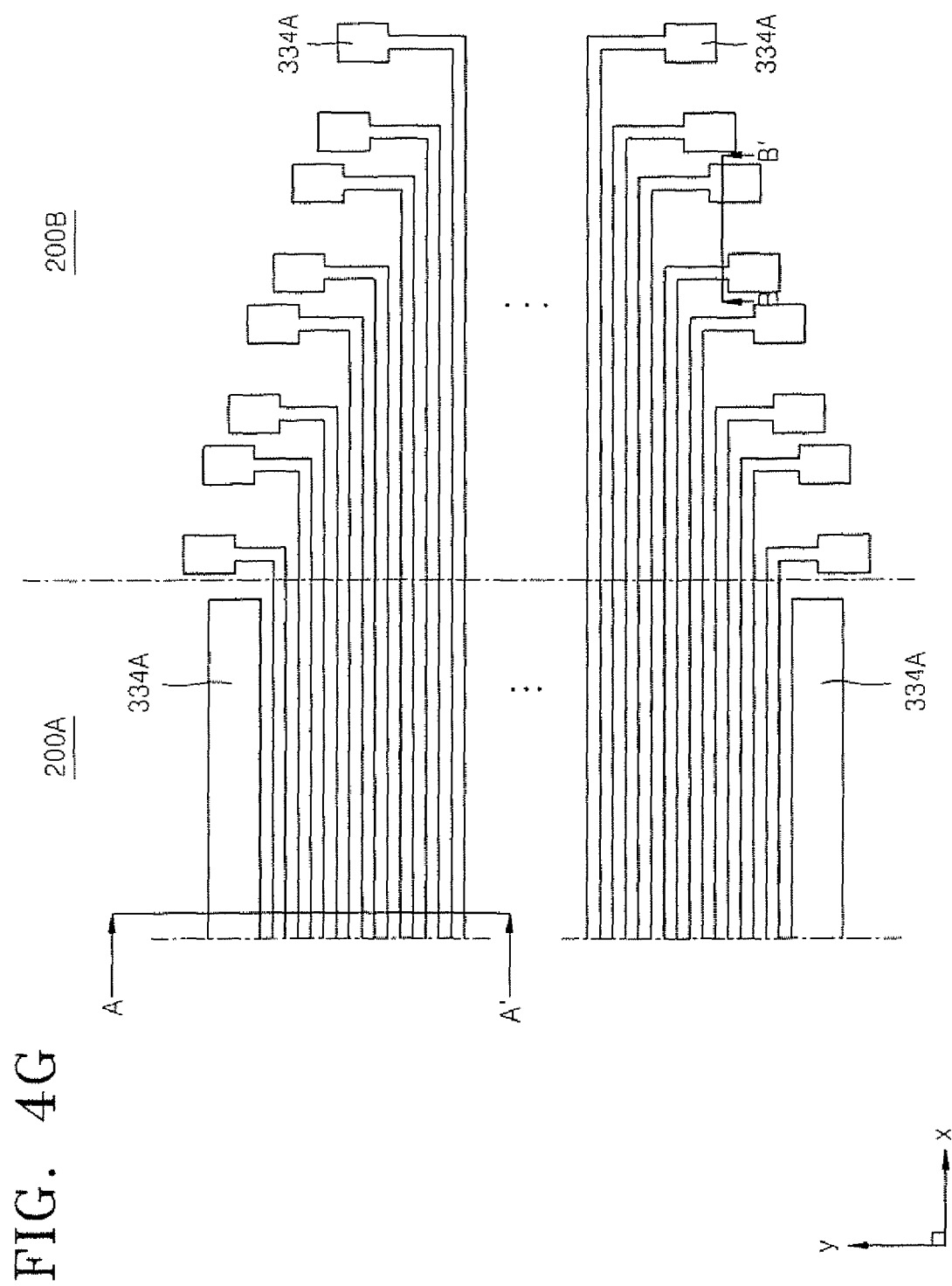

Referring to FIGS. 3H and 4G, in the memory cell region 200A, the connection region 200B, and the peripheral circuit region 200C, a second hard mask pattern 334A is formed by etching the second hard mask layer 334 by using the first and second spacers 350A and 350B and the wide-width mask pattern 370 as an etch mask.

Although not illustrated in FIGS. 3H and 4G, residues of the first and second spacers 350A and 350B and residues of the wide-width mask pattern 370 may remain on the second hard mask pattern 334A.

Figure 3I:
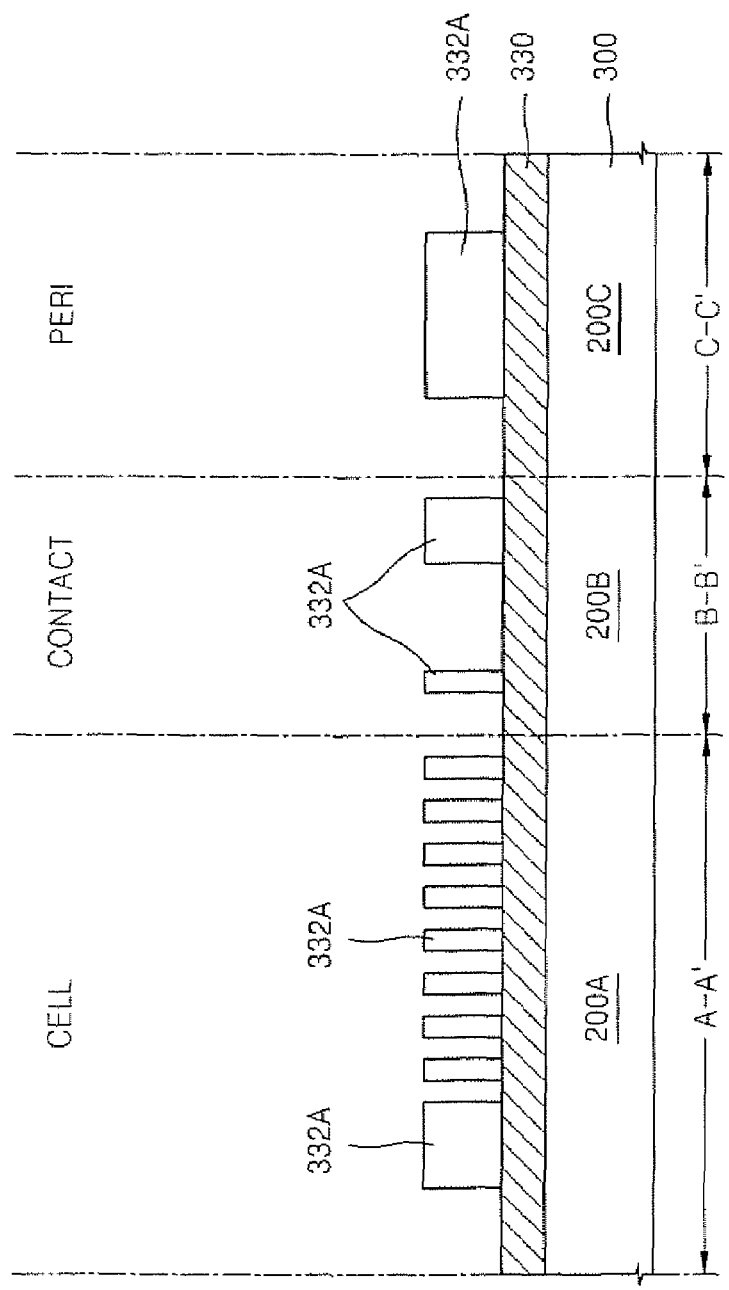
Figure 4H:
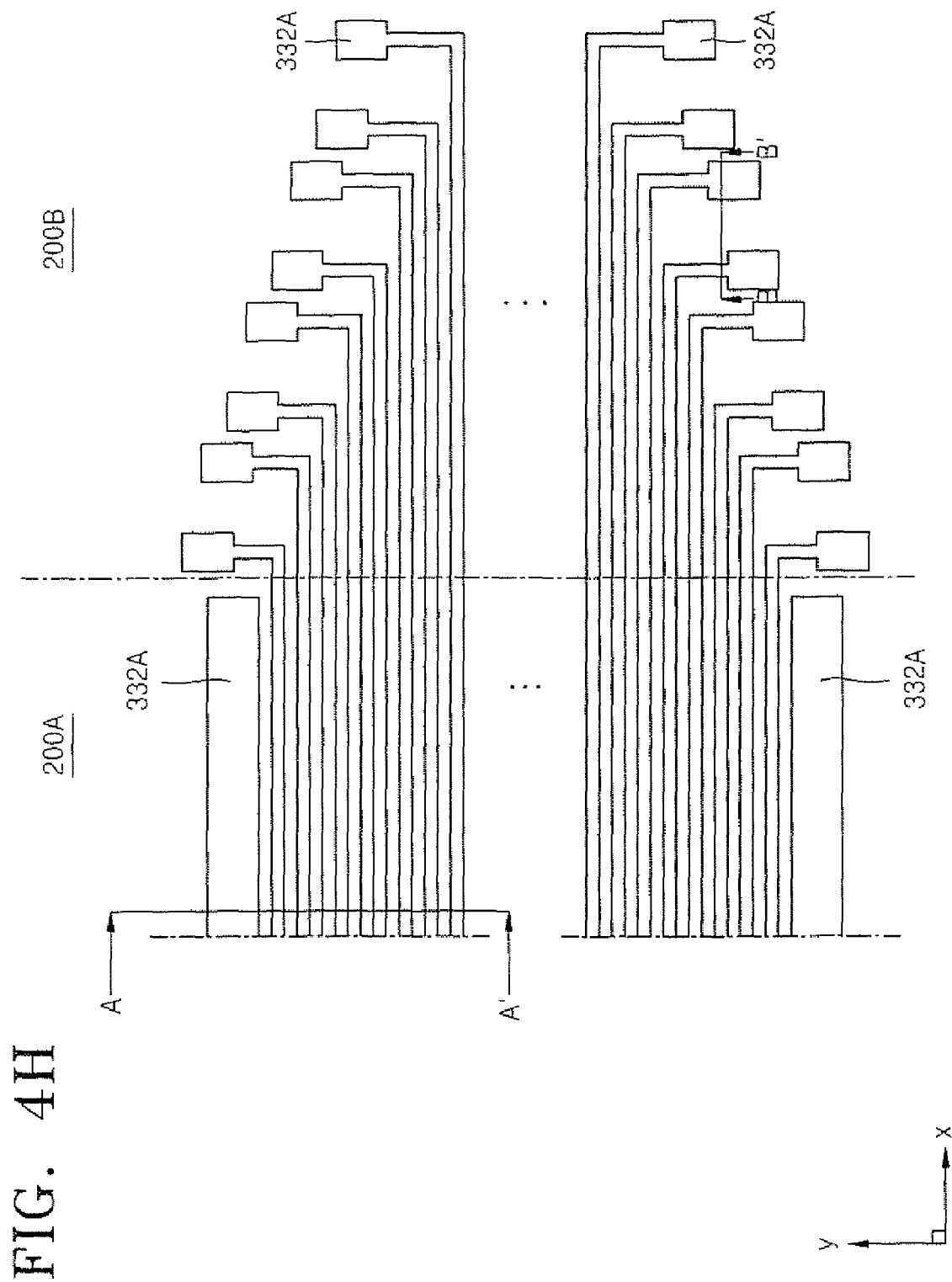

Referring to FIGS. 3I and 4H, in the memory cell region 200A, the connection region 200B, and the peripheral circuit region 200C, a first hard mask pattern 332A is formed by etching the first hard mask layer 332 by using the second hard mask pattern 334A as an etch mask.

Although not illustrated in FIGS. 3I and 4H, a residue of the second hard mask pattern 334A may remain on the first hard mask pattern 332A.

Figure 3J:
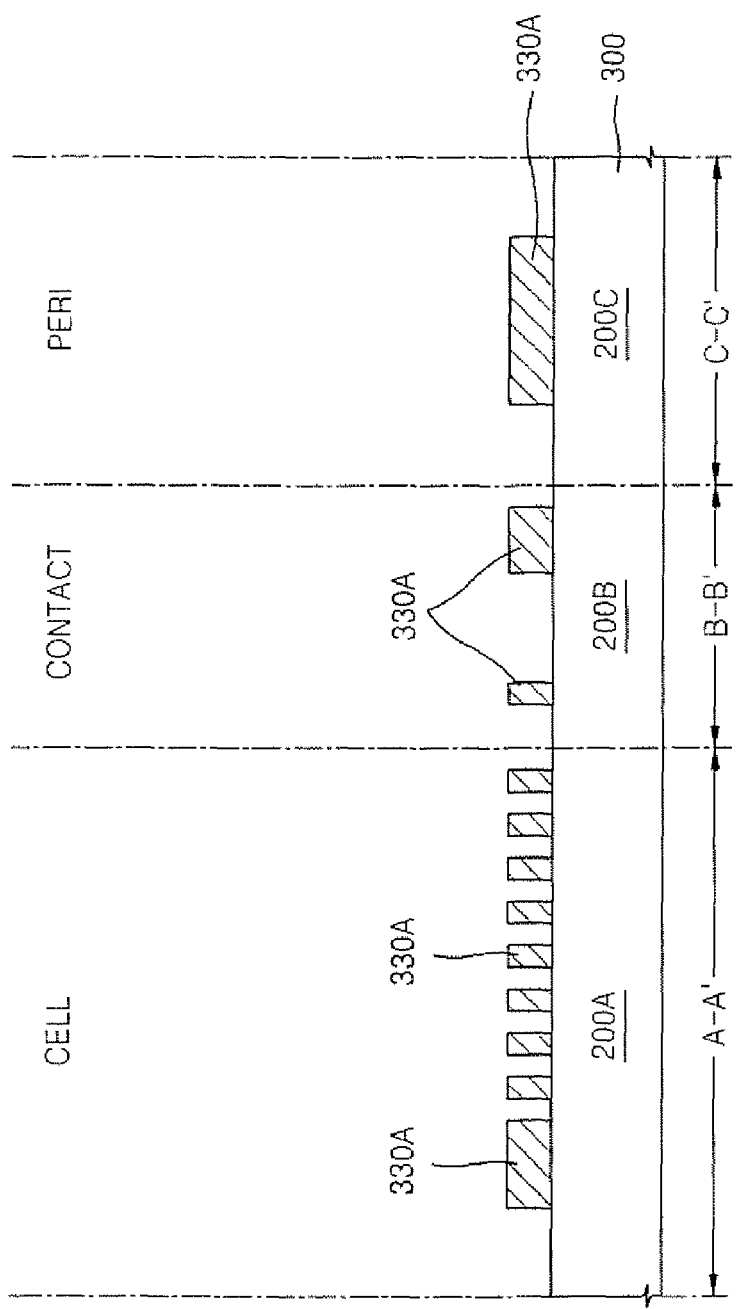

Referring to FIG. 3J, in the memory cell region 200A, the connection region 200B, and the peripheral circuit region 200C, a conductive pattern 330A is formed by etching the conductive layer 330 by using the first hard mask pattern 332A as an etch mask.

Although not illustrated in FIG. 3J, a residue of the first hard mask pattern 332A may remain on the conductive pattern 330A.

The conductive pattern 330A may be used to form the string selection line SSL and the ground selection line GSL, the conductive lines 201, 202, through 232, the contact pads 252, and the peripheral circuit conductive pattern 272, as illustrated in FIG. 2.

According to the method of forming patterns of a semiconductor device, described with reference to FIGS. 3A though 3J and 4A through 4H, in the memory cell region 200A, misalignment does not occur between the string selection line SSL and the ground selection line GSL, and the conductive lines 201, 202, through 232, particularly, the conductive lines 201 and 232 that are most adjacent to the string selection line SSL and the ground selection line GSL, respectively, and a predetermined distance therebetween can be maintained. Thus, the electrical properties of the conductive lines 201 and 232 can be maintained.

Figure 5:
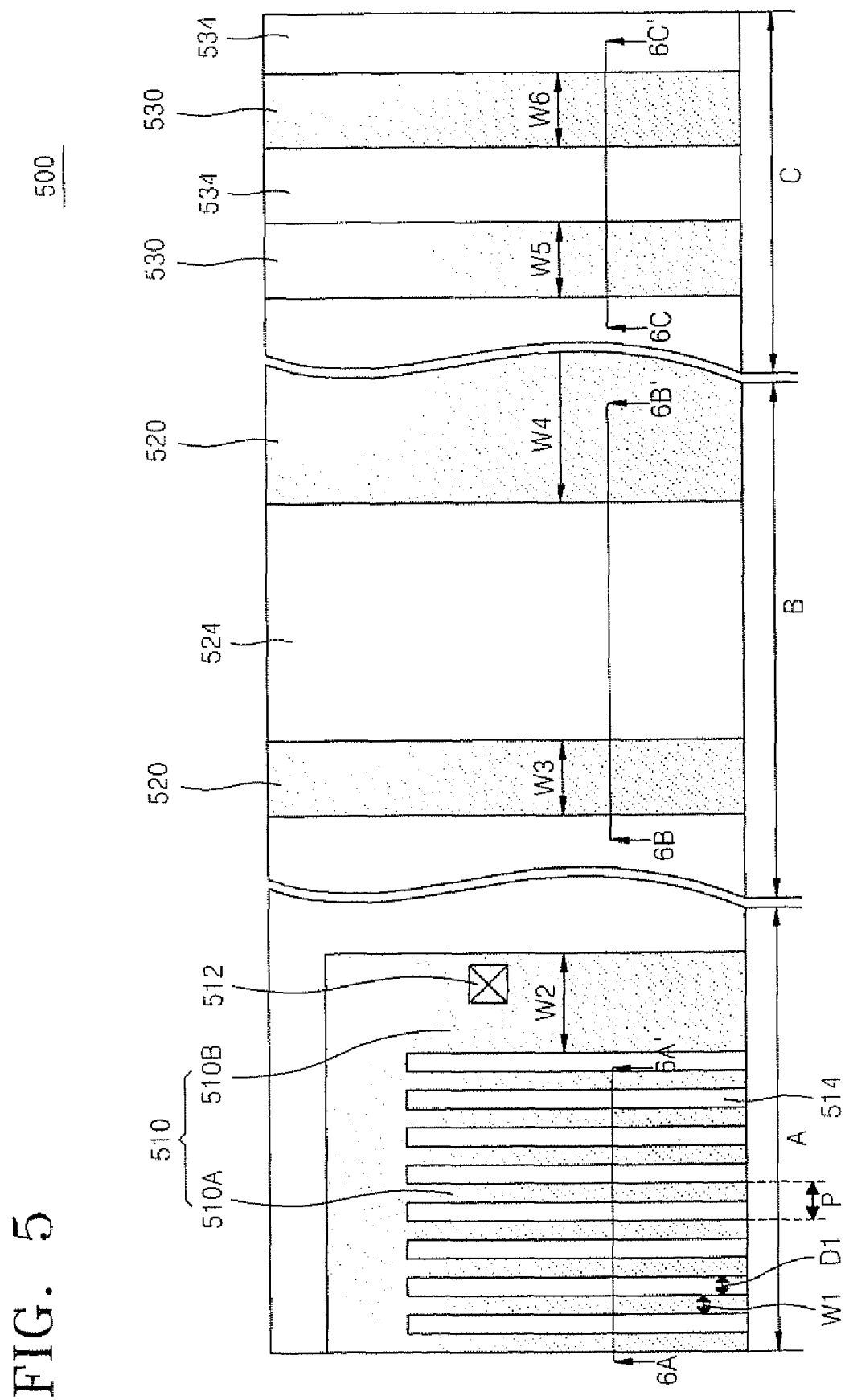
FIG. 5 is a layout of a portion of a semiconductor device that can be realized by a method of forming patterns of a semiconductor device according to another embodiment of the present invention.

FIG. 5 is a layout of a portion of a semiconductor device 500 that can be realized by a method of forming patterns of a semiconductor device according to another embodiment of the present invention.

That is, FIG. 5 illustrates a layout of an active region of the semiconductor device. In FIG. 5, a first region A may be a memory cell region where unit memory devices are formed. For example, the cell array 32 illustrated in FIG. 1 may be formed on the first region A. A second region B may be a peripheral circuit region or a core region where peripheral circuits for driving the unit memory devices formed on the first region A are formed. A third region C may be a key forming region where an align key or an overlay key is formed in order to check the accuracies of alignment and overlay of patterns formed on the first region A or the second region B.

A first active region 510 formed on the first region A may include a narrow-width active region 510A having a first width W1 that is relatively narrow. In addition, the first active region 510 may also include a wide-width active region 510B having a second width W2 that is relatively wide. A wiring contact 512 may be formed on the wide-width active region 510B of the first active region 510. Portions of the narrow-width active region 510A of the first active region 510 may be repeatedly arranged in parallel to one another at a first distance D1 that is relatively small. The first distance D1 may be a width of a first isolation region 514 for defining the narrow-width active region 510A. In the first region A, the first width W1, the second width W2, and the first interval D1 may be designed according to the kind and desired properties of the semiconductor device. If necessary, the first width W1 and the first distance D1 may be the same or not. For example, the first width W1 and the first distance D1 may be determined according to the size of a single memory cell, as determined by a design rule. The size of each of the first width W1 and the first distance D1 may be in the range of 1F to 3F, where F refers to a minimum feature size in a memory cell.

A second active region 520 having a third width W3 or a fourth width W4 that is greater than the width of the narrow-width active region 510A of the first region A may be formed on the second region B. In the second region B, the second active region 520 may be defined by a second isolation region 524.

A third active region 530 having a fifth width W5 or a sixth width W6 that is greater than the width of the narrow-width active region 510A of the first region A may be formed on the third region C. In the third region C, the third active region 530 may be defined by a third isolation region 534.

FIGS. 6A through 6I are cross-sectional views for describing a method of forming patterns of a semiconductor device, according to another embodiment of the present invention.

In FIGS. 6A through 6I, a sectional view taken along line 6A-6A' of FIG. 5 is illustrated in the first region A, a sectional view taken along line 6B-6B' of FIG. 5 is illustrated in the second region B, and a sectional view taken along line 6C-6C' of FIG. 5 in the third region C. In FIGS. 6A through 6I, a sectional view taken along line 6B-6B' of FIG. 5 is illustrated in the second region B, but embodiments of the present invention are not limited thereto. Without departing from the spirit and scope of the present invention, the detailed description of the second region B that is described with reference to FIGS. 6A through 6I may be applied to the formation of the wide-width active region 510B of the first region A of FIG. 2.

Figure 6A:
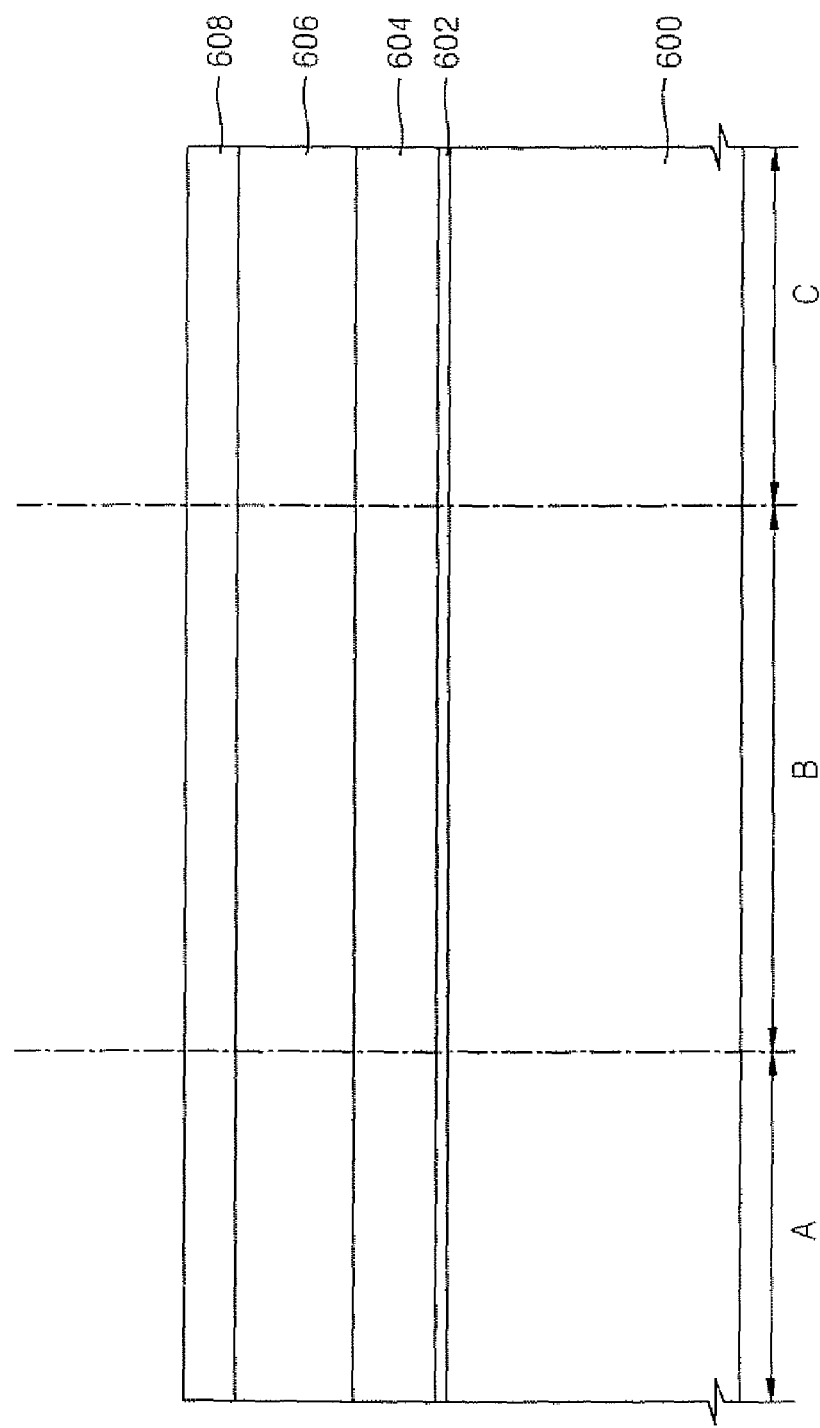

Referring to FIG. 6A, a pad oxide layer 602 is formed on a first region A, a second region B, and a third region C of a substrate 600. Then, a first hard mask layer 604, a second hard mask layer 606 and a third hard mask layer 608 may be sequentially formed on the pad oxide layer 602 in the order stated.

The substrate 600 may be a general semiconductor substrate such as a silicon substrate.

The first hard mask layer 604 and the second hard mask layer 606 may each be a single layer. Alternatively, the first hard mask layer 604 and the second hard mask layer 606 may each have a multi-layered structure including two or more hard mask layers having different etch properties under a predetermined etching condition. For example, the first hard mask layer 604 may be a silicon nitride layer, and the second hard mask layer 606 may be a silicon oxide layer. The third hard mask layer 608 may be polysilicon layer or a silicon nitride layer. If necessary, the third hard mask layer 608 may be omitted.

Figure 6B:
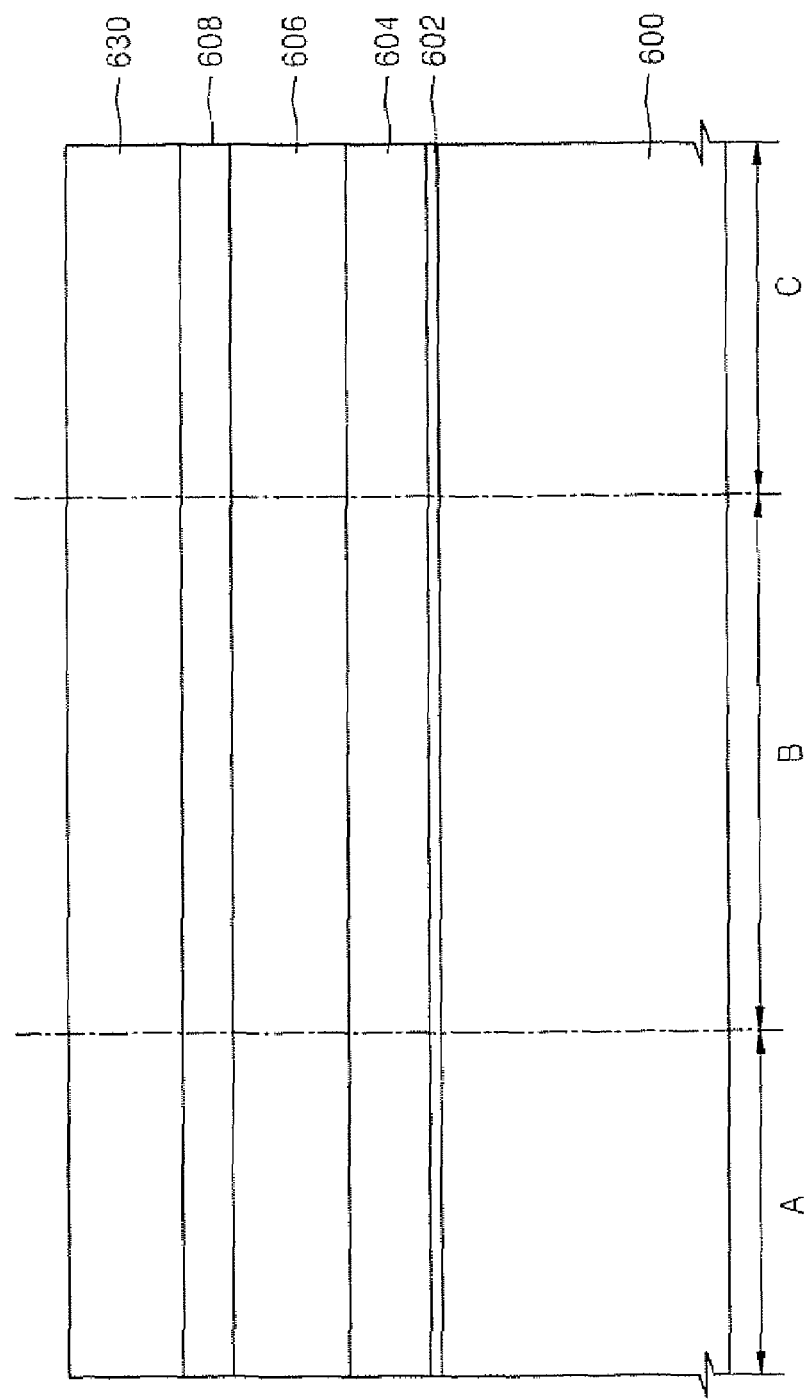

Referring to FIG. 6B, in the first region A, the second region B, and the third region of the substrate 300, a mold mask layer 630 is formed on the third hard mask layer 608.

The mold mask layer 630 may be formed of a material having an etch selectivity with respect to the third hard mask layer 608. For example, the mold mask layer 630 may be an SOH layer.

Figure 6C:
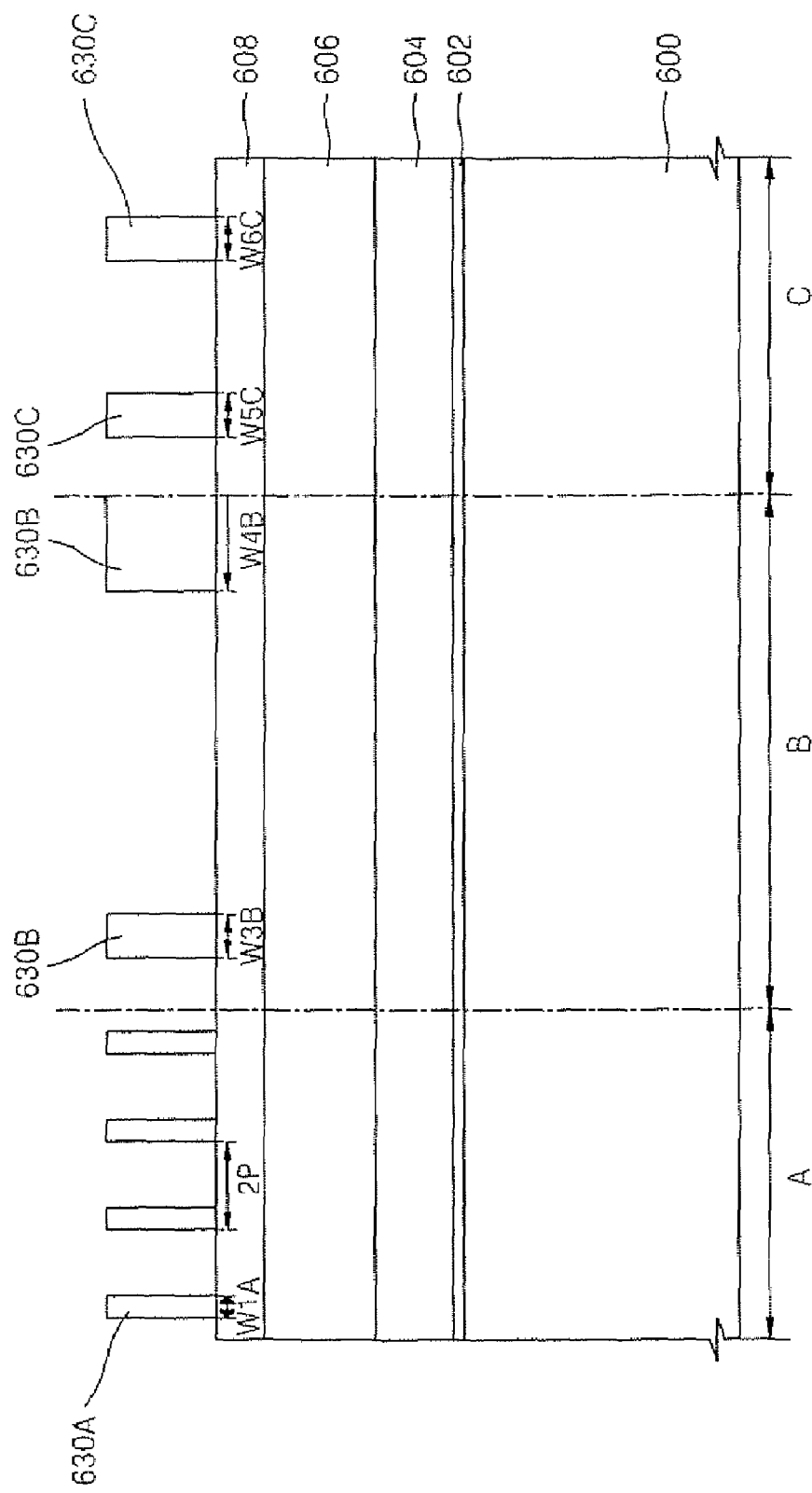

Referring to FIG. 6C, by patterning the mold mask layer 630 in the first region A, the second region B and the third region C of the substrate 600, a plurality of narrow-width mold mask patterns 630A are formed on the third hard mask layer 608 in the first region A, a plurality of wide-width mold mask patterns 630B are formed on the third hard mask layer 608 in the second region B, and a plurality of key forming mold mask patterns 630C are formed on the third hard mask layer 608 in the third region C.

Although not illustrated in FIG. 6C, when an operation related to the second region B is used to form the wide-width active region 510B on the first region A of FIG. 5, the narrow-width mold mask pattern 630A and a wide-width mask (not shown) formed in the first region A may be connected to each other in the first region A.

In order to pattern the mold mask layer 630, a photoresist pattern (not shown) may be used as an etch mask.

In the first region A, the narrow-width mold mask patterns 630A may be formed so as to have a first pitch 2P that is two times greater than a pitch P of an isolation region that is to be finally formed on the substrate 600, particularly, an isolation region interposed between the narrow-width active regions 510A (see FIG. 5). In addition, a width W1A of the narrow-width mold mask pattern 630A may be equal to a width of each of a plurality of isolation trenches that are to be formed on the substrate 600. However, the width W1A of the narrow-width mold mask pattern 630A may be greater or smaller than the width of each of the isolation trenches that are to be formed in the substrate 600, if necessary.

In the second region B, the wide-width mold mask patterns 630B may be formed so as to have a width W3B or W4B that is smaller than a width W3 or W4 of the second active region 520 (see FIG. 5) that is to be finally formed.

In the third region C, the key forming mold mask pattern 630C may be formed so as to have a width W5C or W6C that is smaller than a width W5 or W6 of the third active region 530 (see FIG. 5) that is to be finally formed.

Figure 6D:
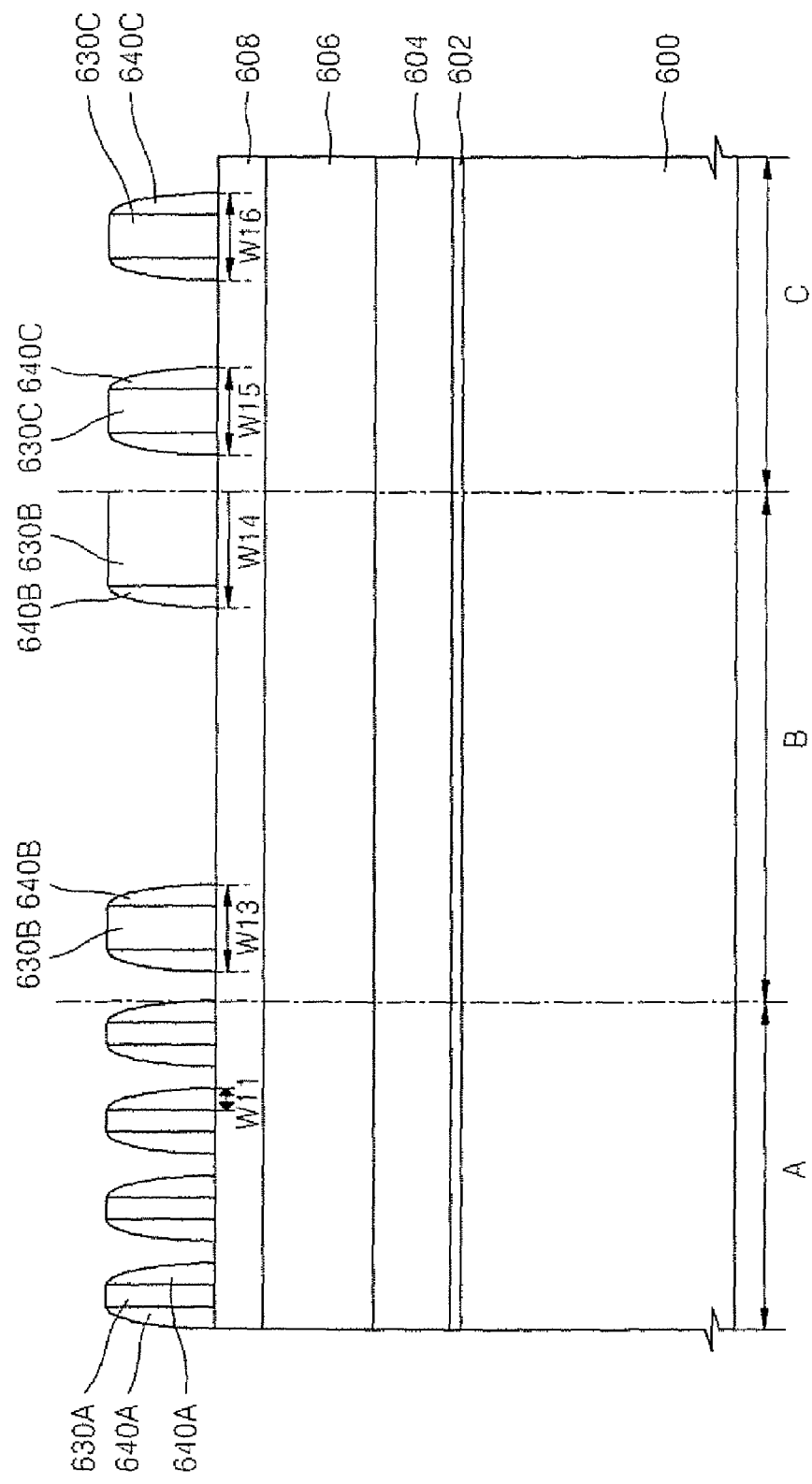

Referring to FIG. 6D, a plurality of spacers 640A, 640B, and 640C are formed on the substrate 600 by forming a mask layer covering an upper surface and sidewalls of each of the narrow-width mold mask patterns 630A, the wide-width mold mask patterns 630B, and the key forming mold mask patterns 630C in a uniform thickness in the first region A, the second region B and the third region C, like in the operation described with reference to FIG. 3B, and then performing etch-back on the mask layer, like in the operation described with reference to FIG. 3C.

The spacers 640A, 640B, and 640C include a plurality of first spacers 640A formed on the third hard mask layer 608 so as to cover sidewalls of the narrow-width mold mask pattern 630A in the first region A, a plurality of second spacers 640B formed on the third hard mask layer 608 so as to cover sidewalls of the wide-width mold mask pattern 630B in the second region B, and a plurality of third spacers 640C formed on the third hard mask layer 608 so as to cover sidewalls of the key forming mold mask pattern 630C in the third region C.

In the second region B, the sum (i.e., W13 or W14) of the width of the wide-width mold mask patterns 630B and the width of the second spacer 640B covering sidewalls thereof may correspond to the width W3 or W4 of the second active region 520 of FIG. 5. The sum (i.e., W15 or W16) of the width of the key forming mold mask pattern 630C and the width of the third spacer 640C covering sidewalls thereof may correspond to the width W5 or W6 of the third active region 530 of FIG. 5.

The first spacer 640A formed on the first region A may have a width W11 that is the same as a width of the first active region 510 to be formed in the first region A, particularly, the width W1 of the narrow-width active region 510A.

Figure 6E:
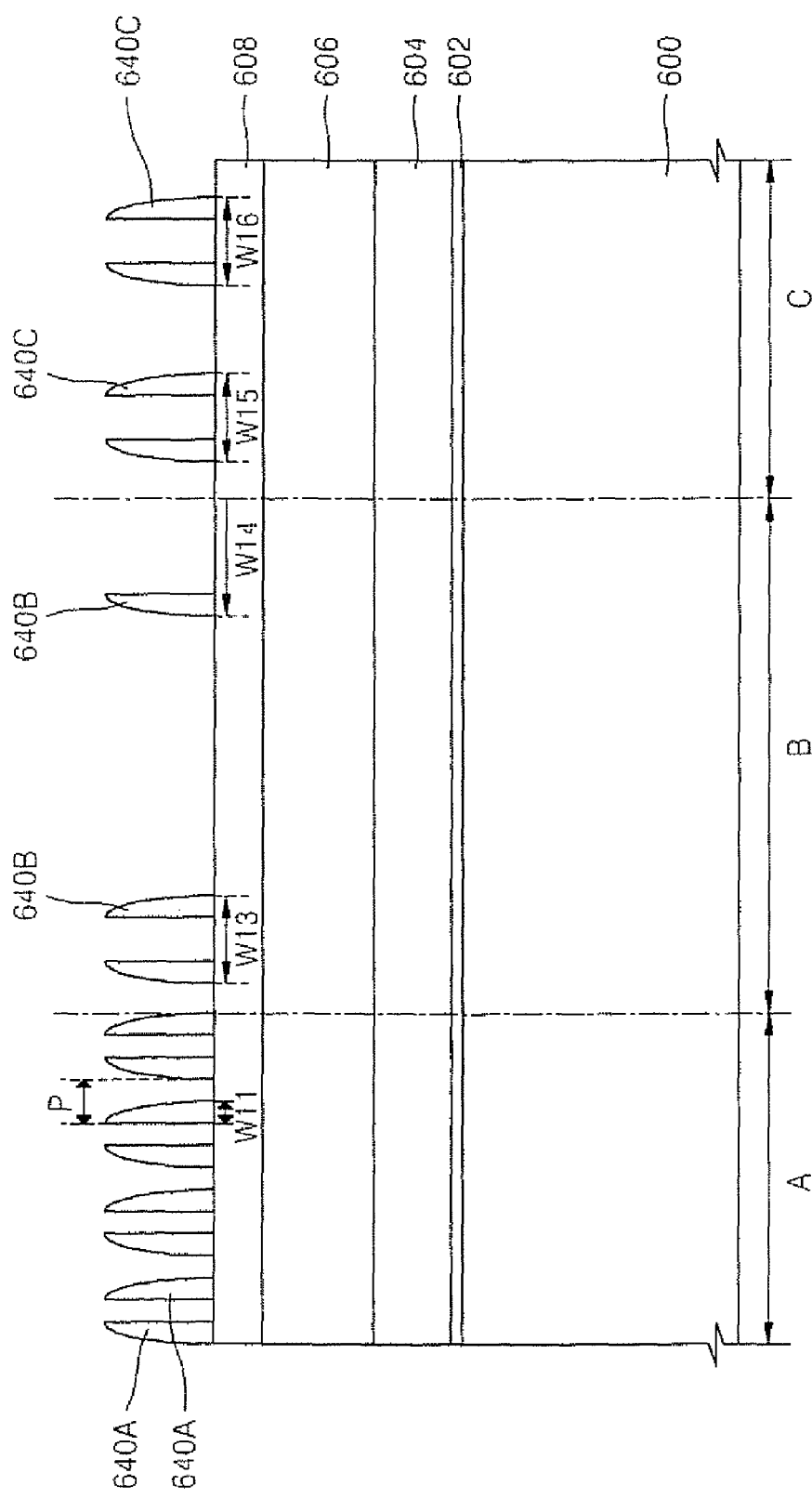

Referring to FIG. 6E, the narrow-width mold mask patterns 630A, the wide-width mold mask patterns 630B, and the key forming mold mask patterns 630C may be removed from the first region A, the second region B, and the third region C, respectively, under a condition where etching is repressed with respect to the first, second, and third spacers 640A, 640B and 640C, and the third hard mask layer 608.

As a result, the first spacers 640A are left on the third hard mask layer 608 in the first region A, the second spacers 640B are left on the third hard mask layer 608 in the second region B, and the third spacers 640C are left on the third hard mask layer 608 in the third region C. In the first region A, the first spacers 640A having a pitch P that is half of the first pitch 2P (see FIG. 6D) may be repeatedly formed.

Figure 6F:
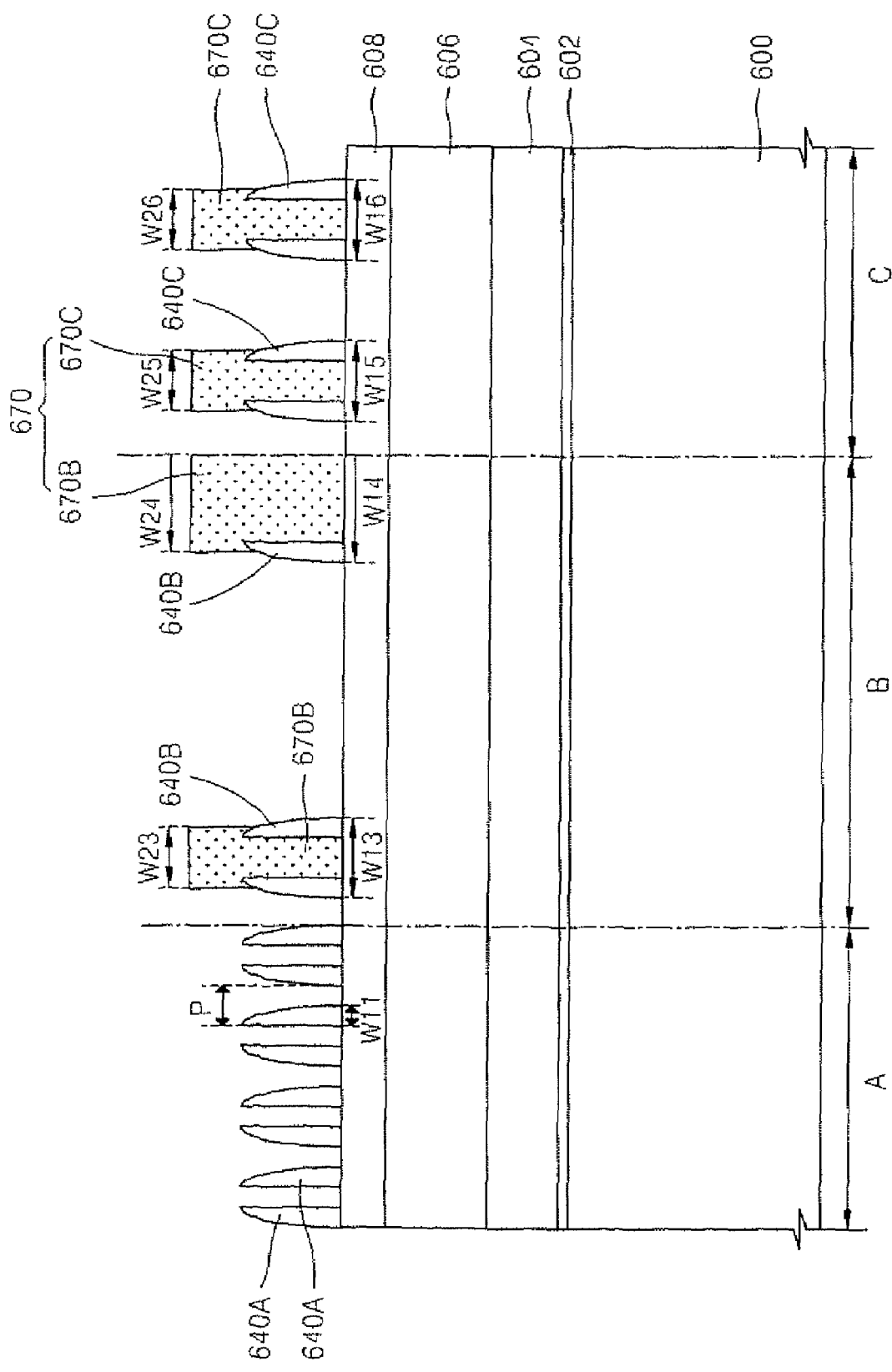

Referring to FIG. 6F, a wide-width mask pattern 670 covering a portion where wide-width patterns are to be formed is formed by forming a wide-width pattern mask layer on the resultant structure including the first, second, and third spacers 640A, 640B and 640C and then patterning the resultant structure, like in the operation described with reference to FIG. 3G.

The wide-width mask pattern 670 may include a first wide-width mask pattern 670B formed on the third hard mask layer 608 so as to fill a gap of the second spacers 640B in the second region B, and a second wide-width mask pattern 670C formed on the third hard mask layer 608 so as to fill a gap of the third spacers 640C in the third region C.

A width W23 or W24 of the first wide-width mask pattern 670B and a width W25 or W26 of the second wide-width mask pattern 670C may be equal to or less than the sum (i.e., W13 or W14) and the sum (i.e., W15 or W16), respectively. In FIG. 6F, the width W23 or W24 of the first wide-width mask pattern 670B and the width W25 or W26 of the second wide-width mask pattern 670C are less than the sum (i.e., W13 or W14) and the sum (i.e., W15 or W16), respectively.

The first wide-width mask pattern 670B and the second wide-width mask pattern 670C may be simultaneously formed using a photolithography process.

During the photolithography process for the forming of the first wide-width mask pattern 670B and the second wide-width mask pattern 670C, a processing margin can be obtained as much as the width of the second spacers 640B and the width of the third spacers 640C.

Each of the first wide-width mask pattern 670B and the second wide-width mask pattern 670C may have a stack structure including an SOH layer having a planarized upper surface and a SiON layer covering the SOH layer. Alternatively, each of the first wide-width mask pattern 670B and the second wide-width mask pattern 670C may include a DBARC layer, and a photoresist pattern covering the DBARC layer.

Figure 6G:
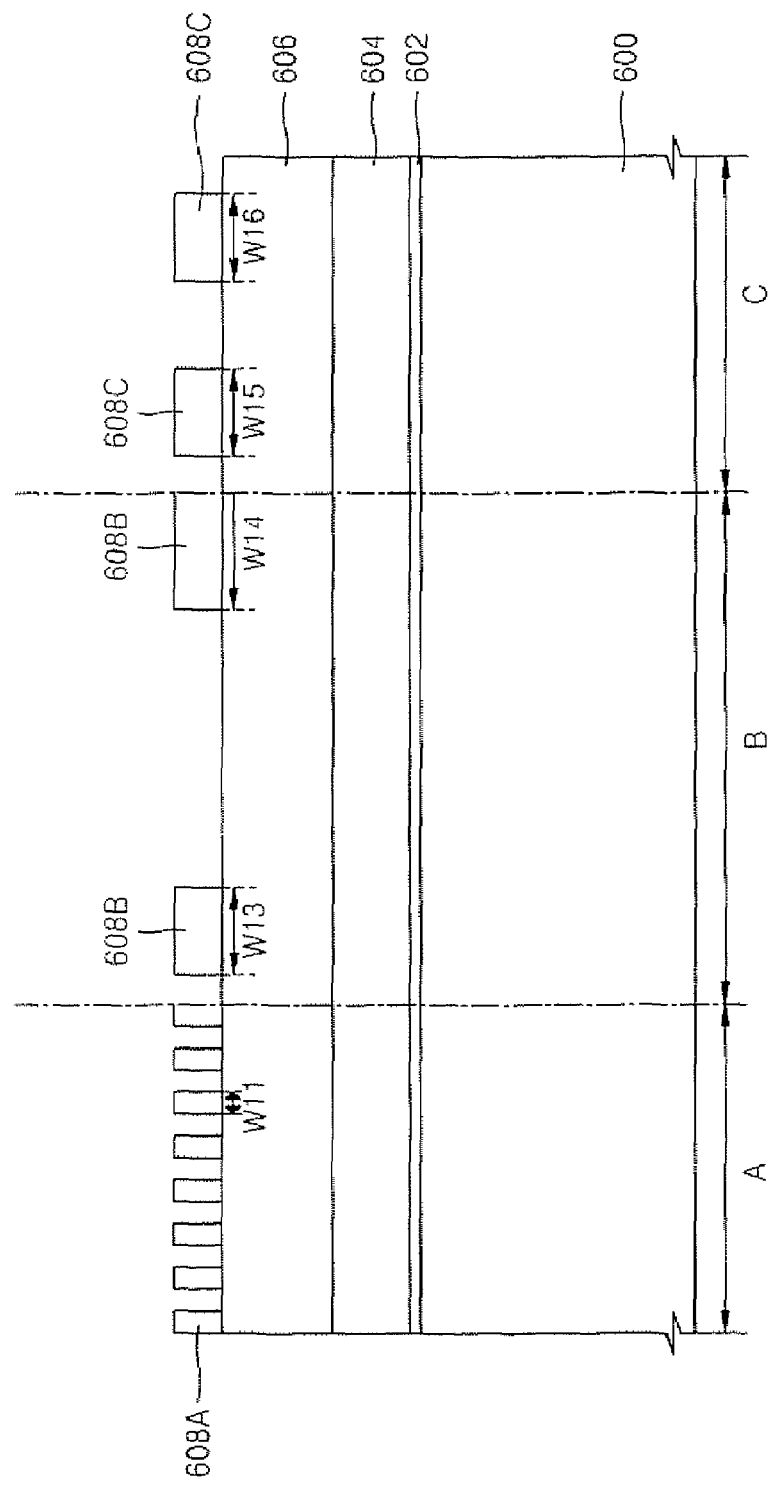

Referring to FIG. 6G, a plurality of third hard mask patterns 608A, 608B, and 608C through which portions of the second hard mask layer 606 are exposed in the first region A, the second region B and the third region C, respectively, are formed by etching the third hard mask layer 608 by using the first spacers 640A as an etch mask in the first region A, the second spacers 640B and the first wide-width mask pattern 670B as an etch mask in the second region B, and the third spacers 640C and the second wide-width mask pattern 670C as an etch mask in the third region C.

Although not illustrated in FIG. 6G, residues of the first, second, and third spacers 640A, 640B and 640C, the first wide-width mask pattern 670B, and the second wide-width mask pattern 670C may remain on the third hard mask patterns 608A, 608B, and 608C.

Referring to FIG. 6H, a plurality of second hard mask patterns 606A, 606B, and 606C, a plurality of first hard mask patterns 604A, 604B, and 604C, and a plurality of pad oxide layer patterns 602A, 602B, and 602C through which portions of the substrate 600 are exposed by etching the second hard mask layer 606, the first hard mask layer 604 and the pad oxide layer 602 by using the third hard mask patterns 608A, 608B, and 608C as etch masks in the first region A, the second region B and the third region C, respectively.

Although not illustrated in FIG. 6H, residues of the third hard mask patterns 608A, 608B, and 608C may remain on the second hard mask patterns 606A, 606B, and 606C.

Figure 6I:
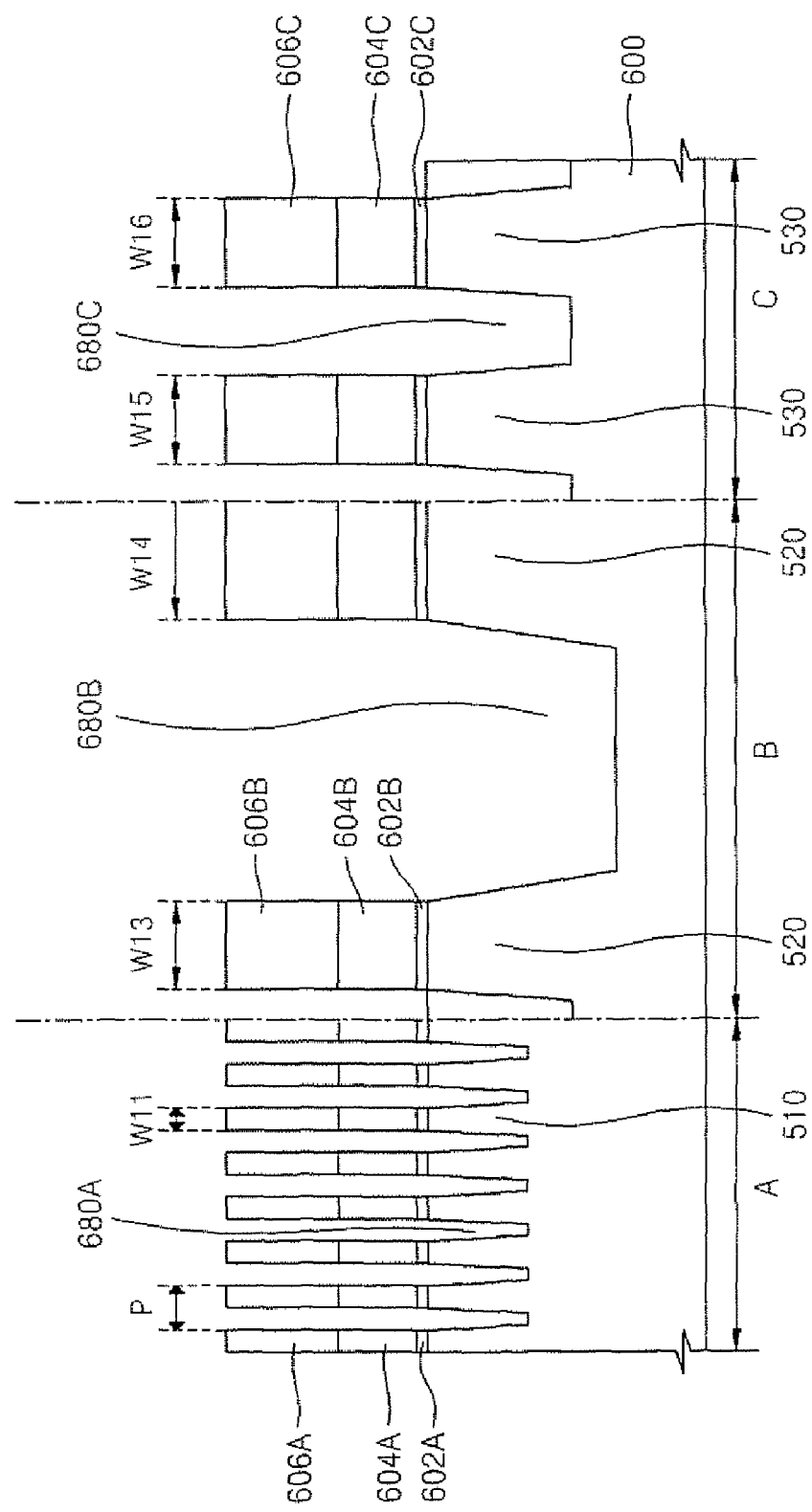

Referring to FIG. 6I, a plurality of first trenches 680A, a plurality of second trenches 680B, and a plurality of third trenches 680C are simultaneously formed by etching the substrate 600 by using the second hard mask patterns 606A, 606B, and 606C, and the first hard mask patterns 604A, 604B, and 604C as etch masks in the first region A, the second region B, and the third region C of the substrate 600, respectively. The first trench 680A, the second trench 680B, and the third trench 680C may be formed to have different depths according to the width thereof, measured in an extending direction of a main surface of the substrate 600. In the first region A, the first trenches 680A having a pitch P that is half of the first pitch 2P (see FIG. 3D) may be repeatedly formed.

After the first trenches 680A, the second trenches 680B, and the third trenches 680C are formed in the first region A, the second region B, and the third region C, respectively, the second hard mask patterns 606A, 606B and 606C may be removed by predetermined thicknesses.

Then, a plurality of isolation regions (not shown) defining the first active region 510, the second active region 520, and the third active region 530 (see FIG. 5) may be formed by filling the first trenches 680A, the second trenches 680B and the third trenches 680C with an insulating material. Isolation layers (not shown) formed in the first trenches 680A, the second trenches 680B, and the third trenches 680C may define the isolation region 514, the second isolation region 524, and the third isolation region 534 of FIG. 5. In particular, the isolation region formed in the third trench 680C in the third region C, that is, the third isolation region 534 (see FIG. 5) and the third active region 530 may include an align key or an overlay key in order to check the accuracies of alignment and overlay of patterns formed on the cell array region or the peripheral circuit region.

According to the method of forming patterns of a semiconductor device, described with reference to FIGS. 6A through 6I, when patterns are simultaneously formed in a plurality of regions of a substrate in which the densities and widths of patterns are different from each other, narrow-width patterns are formed by using the first spacers 664A, having a doubled pattern density obtained using a double patterning process, as an etch mask in a high-density narrow-width pattern region such as the cell array region, the first wide-width mask pattern 670B and the second wide-width mask pattern 670C are formed on the second spacers 640B and the third spacers 640C, respectively, which are simultaneously formed together with the first spacers 640A, in a wide-width pattern region, and wide-width patterns each having a width defined by the second spacers 640B and the third spacers 640C are formed by using the second spacers 640B and the third spacers 640C, and the first wide-width mask pattern 670B and the second wide-width mask pattern 670C as etch masks. Thus, patterns having various densities and widths can be formed on the substrate 600 by simultaneously etching a plurality of regions of the substrate 600. In addition, in the cell array region of the substrate 600, trenches that define a plurality of active regions and each have a narrow-width may be simultaneously formed together with trenches each having a wide-width and an alignment key or an overlay key. In particular, since various widths of patterns are defined by the first, second, and third spacers 640A, 640B, and 640C that are formed using a single photography process, misalignment does not occur between the first, second, and third spacers 640A, 640B, and 640C, and thus uniform intervals between the first, second, and third spacers 640A, 640B, and 640C can be maintained.

While the inventive concept has been particularly shown and described with reference to exemplary embodiments thereof, it will be understood that various changes in form and details may be made therein without departing from the spirit and scope of the following claims.

What is claimed is:

1. A method of forming patterns of a semiconductor device, comprising:
    forming a first mold mask pattern and a second mold mask pattern, having different widths, on a substrate;
    forming a pair of first spacers covering both sidewalls of the first mold mask pattern and a pair of second spacers covering both sidewalls of the second mold mask pattern;
    removing the first mold mask pattern and the second mold mask pattern to expose the substrate through a first gap between the pair of first spacers and a second gap between the pair of second spacers;
    forming a wide-width mask pattern covering an internal space of the second gap and the second spacer after the removing of the first mold mask pattern and the second mold mask pattern; and
    etching the substrate by using the first spacers, the second spacers, and the wide-width mask pattern as an etch mask.

2. The method of claim 1, wherein the wide-width mask pattern is formed so as to fill the internal space of the second gap, and
    wherein the wide-width mask pattern has a width that is less than a distance between outermost sidewalls of the pair of second spacers, and is formed so as to cover the pair of second spacers.

3. The method of claim 1, wherein the wide-width mask pattern is formed so as to fill the internal space of the second gap, and
    wherein, after the wide-width mask pattern is formed, outermost sidewalls of the pair of second spacers are exposed around both sidewalls of the wide-width mask pattern.

4. The method of claim 1, wherein the wide-width mask pattern is formed so as to cover only one of the pair of second spacers.

5. The method of claim 1, wherein the wide-width mask pattern comprises a carbon-containing (SOH) layer covering the second spacers, and a SiON layer covering the SOH layer.

6. The method of claim 1, wherein the wide-width mask pattern comprises a developable bottom anti-reflective coating film (DBARC) layer covering the second spacers, and a photoresist pattern covering the DBARC layer.

7. The method of claim 1, wherein the substrate comprises a semiconductor substrate, and an etched layer formed on the semiconductor substrate,
   wherein the etching of the substrate comprises etching the etched layer so as to simultaneously form a first pattern and a second pattern having different widths.

8. The method of claim 7, wherein the substrate comprises a memory cell region,
   wherein the first pattern is a first conductive line formed in the memory cell region, and
   wherein the second pattern is a second conductive line adjacent to the first conductive line.

9. The method of claim 1, wherein the substrate comprises a semiconductor substrate, and an etched layer formed on the semiconductor substrate,
   wherein the etching of the substrate comprises etching the etched layer to simultaneously form a first pattern and a second pattern having different widths; and etching the substrate by using the first pattern and the second pattern as an etch mask to form a plurality of trenches in the substrate.

10. A method of forming patterns of a semiconductor device, comprising:
   forming a hard mask layer on a substrate comprising a first region and a second region;
   forming a plurality of narrow-width mold mask patterns on the hard mask layer in the first region, and a plurality of wide-width mold mask patterns on the hard mask layer in the second region;
   simultaneously forming a plurality of first spacers covering sidewalls of each of the plurality of narrow-width mold mask patterns, and a plurality of second spacers covering sidewalls of each of the plurality of wide-width mold mask patterns;
   removing the plurality of narrow-width mold mask patterns and the plurality of wide-width mold mask patterns in the first region and the second region;
   forming a wide-width mask pattern covering portions of the plurality of second spacers in the second region after the removing of the plurality of narrow-width mold mask patterns and the plurality of wide-width mold mask patterns; and
   etching the hard mask layer by using the plurality of first spacers, the plurality of second spacers and the wide-width mask pattern as an etch mask so as to form a plurality of hard mask patterns comprising a narrow-width hard mask pattern and a wide-width hard mask pattern.

11. The method of claim 10, wherein the wide-width mask pattern is formed so as to fill an internal space of a gap between a pair of second spacers selected from the plurality of second spacers, and
   wherein the wide-width mask pattern has a width that is less than a distance between outermost sidewalls of the pair of second spacers, and is formed so as to cover the pair of second spacers.

12. The method of claim 10, wherein the wide-width mask pattern is formed so as to fill an internal space of a gap between a pair of second spacers selected from the plurality of second spacers, and
   wherein, after the wide-width mask pattern is formed, outermost sidewalls of the pair of second spacers are exposed around both sidewalls of the wide-width mask pattern.

13. The method of claim 10, wherein the wide-width mask pattern comprises a carbon-containing (SOH) layer covering the second spacers, and a SiON layer covering the SOH layer.

14. The method of claim 10, wherein the wide-width mask pattern comprises a developable bottom anti-reflective coating film (DBARC) layer covering the portions of the plurality of second spacers, and a photoresist pattern covering the DBARC layer.

15. The method of claim 10, wherein the substrate comprises a semiconductor substrate, and an etched layer formed on the semiconductor substrate, and
   wherein the hard mask layer is formed on the etched layer.

16. The method of claim 15, further comprising etching the etched layer using the plurality of hard mask patterns as an etch mask to form a first pattern and a second pattern having different widths.

17. The method of claim 16, wherein the substrate comprises a memory cell region,
   wherein the first pattern is a first conductive line formed in the memory cell region, and
   wherein the second pattern is a second conductive line neighboring the first conductive line in the memory cell region.

18. The method of claim 10, further comprising etching the substrate using the plurality of hard mask patterns as an etch mask to form a plurality of trenches in the substrate.

* * * * *